United States Patent
Wu et al.

(10) Patent No.: US 10,879,354 B2
(45) Date of Patent: Dec. 29, 2020

(54) SEMICONDUCTOR DEVICE AND FORMING METHOD THEREOF

(71) Applicant: TAIWAN SEMICONDUCTOR MANUFACTURING CO., LTD., Hsinchu (TW)

(72) Inventors: Chii-Ming Wu, Taipei (TW); Cheng-Ta Wu, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/495,962

(22) Filed: Apr. 24, 2017

(65) Prior Publication Data
US 2018/0151670 A1 May 31, 2018

Related U.S. Application Data

(60) Provisional application No. 62/427,067, filed on Nov. 28, 2016.

(51) Int. Cl.
*H01L 21/225* (2006.01)
*H01L 29/08* (2006.01)
*H01L 29/78* (2006.01)
*H01L 29/165* (2006.01)
*H01L 21/76* (2006.01)
*H01L 29/66* (2006.01)
*H01L 21/8238* (2006.01)
*H01L 23/535* (2006.01)
*H01L 27/092* (2006.01)
*H01L 29/06* (2006.01)

(52) U.S. Cl.
CPC ...... *H01L 29/0847* (2013.01); *H01L 21/2254* (2013.01); *H01L 21/2256* (2013.01); *H01L 21/76* (2013.01); *H01L 21/823814* (2013.01); *H01L 21/823821* (2013.01); *H01L 21/823871* (2013.01); *H01L 23/535* (2013.01); *H01L 27/0924* (2013.01); *H01L 29/0653* (2013.01); *H01L 29/165* (2013.01); *H01L 29/66636* (2013.01); *H01L 29/66795* (2013.01); *H01L 29/785* (2013.01); *H01L 29/7848* (2013.01); *H01L 27/092* (2013.01)

(58) Field of Classification Search
None
See application file for complete search history.

(56) References Cited

U.S. PATENT DOCUMENTS

| | | | |
|---|---|---|---|
| 6,165,826 A * | 12/2000 | Chau | H01L 21/2254 438/231 |
| 8,440,552 B1 * | 5/2013 | Chen | H01L 21/2255 257/623 |
| 8,836,016 B2 | 9/2014 | Wu et al. | |
| 8,841,701 B2 | 9/2014 | Lin et al. | |
| 8,847,293 B2 | 9/2014 | Lee et al. | |

(Continued)

*Primary Examiner* — Abul Kalam
(74) *Attorney, Agent, or Firm* — Maschoff Brennan

(57) ABSTRACT

A semiconductor device includes a semiconductor substrate, a dielectric feature and an epitaxy feature. The epitaxy feature is on the semiconductor substrate. The epitaxy feature has a top central portion and a corner portion. The dielectric feature is closer to the corner portion than the top central portion, and the corner portion has an impurity concentration higher than that of the top central portion.

20 Claims, 17 Drawing Sheets

(56) References Cited

U.S. PATENT DOCUMENTS

| | | |
|---|---|---|
| 8,853,025 B2 | 10/2014 | Zhang et al. |
| 8,962,400 B2 | 2/2015 | Tsai et al. |
| 9,012,310 B2 | 4/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 2011/0068396 A1* | 3/2011 | Cheng .................. H01L 29/165 257/335 |
| 2011/0129990 A1* | 6/2011 | Mandrekar ......... H01L 21/2256 438/558 |
| 2011/0269287 A1* | 11/2011 | Tsai .................... H01L 21/2254 438/306 |
| 2015/0044842 A1* | 2/2015 | Wang .................. H01L 29/665 438/296 |

* cited by examiner

SEMICONDUCTOR DEVICE AND FORMING METHOD THEREOF

PRIORITY CLAIM AND CROSS-REFERENCE

This application claims priority to U.S. Provisional Application Ser. No. 62/427,067, filed Nov. 28, 2016, which is herein incorporated by reference.

BACKGROUND

As the semiconductor industry has strived for higher device density, higher performance, and lower costs, problems involving both fabrication and design have been encountered. One solution to these problems has been the development of a fin-like field effect transistor (FinFET). A FinFET includes a thin vertical 'fin' formed in a free standing manner over a major surface of a substrate. The source, drain, and channel portions are defined within this fin. The transistor's gate wraps around the channel portion of the fin. This configuration allows the gate to induce current flow in the channel from three sides. Thus, FinFET devices have the benefit of higher current flow and reduced short-channel effects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
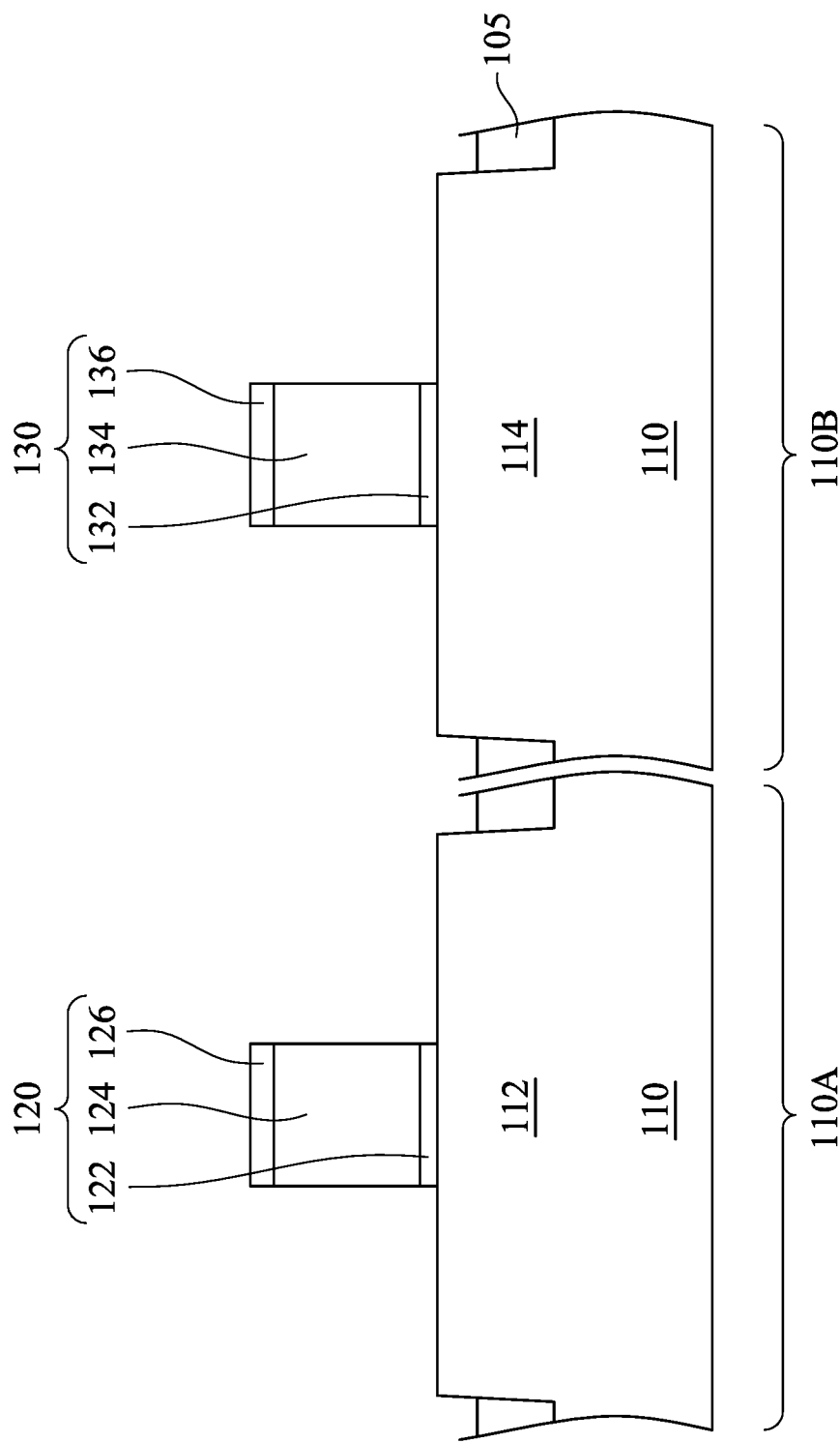
FIG. 1 to FIG. 16 illustrate a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fins according to following embodiments of the present disclosure may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 to FIG. 16 illustrate a method for manufacturing a semiconductor device at various stages in accordance with some embodiments of the present disclosure. Reference is made to FIG. 1. Substrate 110 is illustrated, and it may be a semiconductor substrate, such as a bulk semiconductor, a semiconductor-on-insulator (SOI) substrate, or the like, which may be doped (e.g., with a p-type or an n-type dopant) or undoped. The substrate 110 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 110 has a first portion 110A and a second portion 110B. The first portion 110A can be for forming n-type devices, such as NMOS transistors, such as n-type FinFETs. The second portion 110B can be for forming p-type devices, such as PMOS transistors, such as p-type FinFETs.

Semiconductor fins 112 and 114 are formed on the substrate 110. In some embodiments, the semiconductor fins 112 and 114 include silicon. The semiconductor fins 112 and 114 may be formed, for example, by patterning and etching the substrate 110 using photolithography techniques. For example, a layer of photoresist material (not shown) is deposited over the substrate 110. The layer of photoresist material is irradiated (exposed) in accordance with a predetermined pattern (the semiconductor fins 112 and 114 in this case) and developed to remove portions of the photoresist material. The remaining photoresist material protects the underlying material from subsequent processing steps, such as etching. It is noted that other masks, such as an oxide or silicon nitride mask, may also be used in the etching process.

An isolation dielectric 105 is formed to fill trenches between the semiconductor fins 112 and 114 as shallow trench isolation (STI). The isolation dielectric 105 may include any suitable dielectric material, such as silicon oxide, a nitride, the like, or combinations thereof. The method of forming the isolation dielectric 105 may include depositing an isolation dielectric 105 on the substrate 110 to cover the semiconductor fins 112 and 114, optionally performing a planarization process to remove the excess isolation dielectric 105 outside the trenches, and then performing an etching process on the isolation dielectric 105 until upper portions of the semiconductor fins 112 and 114 are exposed. The isolation dielectric 105 may be deposited using a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials formed by any acceptable process may be used.

It is understood that the processes described above are some examples of how semiconductor fins 112 and 114 may be formed. In other embodiments, a dielectric layer can be formed over a top surface of the substrate 110; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, at least one of the semiconductor fins 112 and 114 can be recessed, and a material different from the at least one of the semiconductor fins 112 and 114 may be epitaxially grown in their place. In even further embodiments, a dielectric layer can be formed over a top surface of the substrate 110; trenches can be etched through the dielectric layer; heteroepitaxial structures can be epitaxially grown in the trenches using a material different from the substrate 110; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. Still further, it may be advantageous to epitaxially grow a material in an NMOS portion (such as the first portion 110A) different from the material in a PMOS portion (such as the second portion 110B). The epitaxy growth in the NMOS portion can be performed before the epitaxy growth in the PMOS portion, and vice versa. In some embodiments, at least one of the semiconductor fins 112 and 114 may include silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Gate structures or gate stacks 120 and 130 are respectively formed on the semiconductor fins 112 and 114. The gate structure 120 includes a gate dielectric layer 122 and a gate electrode 124 with a mask layer 126 over the gate electrode 124, and the gate structure includes 130 includes a gate dielectric layer 132 and a gate electrode 134 with a mask layer 136 over the gate electrode 134. The gate structure 120 may cross over a plurality of substantially parallel semiconductor fins 112, and the gate structure 130 may cross over a plurality of substantially parallel semiconductor fins 114. The gate structures 120 and 130 have longitudinal axes that are substantially perpendicular to the longitudinal axes of the semiconductor fins 112 and 114. In some embodiments, the gate structures 120 and 130 are dummy gate structures and will be replaced with a replacement gate structure using a "gate-last" or replacement-gate process. In other embodiments, the gate structures 120 and 130 are active gates and are formed in a "gate-first process" and will not be replaced.

The gate dielectric layers 122 and 132 may be formed using thermal oxidation, in-situ steam generation (ISSG) process, chemical vapor deposition (CVD), a spin-on-glass process, sputtering, or any other suitable techniques to form gate dielectrics. The gate dielectric layers 122 and 132 can be patterned to respectively wrap central portions of the semiconductor fins 112 and 114 and respectively expose other portions of the semiconductor fins 112 and 114. In some embodiments, the gate dielectric layers 122 and 132 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, the like, or a combination thereof. In other embodiments, the gate dielectric layer includes dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, the like, or combinations and multi-layers thereof.

The gate electrodes 124 and 134 are formed over the gate dielectric layers 122 and 132, respectively. The gate electrodes 124 and 134 may be formed by first forming a gate electrode layer (not shown) over the semiconductor fins 112 and 114 and the isolation dielectric 105 and then patterning the gate electrode layer to form the gate electrodes 124 and 134. In some embodiments, the gate dielectric layers 122 and 132 and the gate electrodes 124 and 134 may be patterned by the same process. In some embodiments, the gate electrode layer may include polycrystalline-silicon (poly-Si), poly-crystalline silicon-germanium (poly-SiGe), metallic nitrides, metallic silicides, metallic oxides, or metals. In some embodiments, the gate electrode layer includes a metal-containing material such as TiN, TaN, TaC, Co, Ru, Al, combinations thereof, or multi-layers thereof. The gate electrode layers may be deposited by CVD, physical vapor deposition (PVD), sputter deposition, or other techniques suitable for depositing conductive materials. The mask layers 126 and 136, such as photoresists, hard masks, combinations thereof, or multi-layers thereof, may be formed and patterned over the gate electrode layer. Pattern of the patterned mask layers 126 and 136 may then be transferred to the material of the gate electrode layer using acceptable photolithography and etching techniques to form the gate electrodes 124 and 134.

In some embodiments, after forming the gate structures 120 and 130 on portions of the semiconductor fins 112 and 114, ion implant may be performed to other portions of the semiconductor fins 112 and 114 not covered by the gate structures 120 and 130, so as to form lightly doped drain (LDD) portions (not shown) in the semiconductor fins 112 and 114. After the LDD ion implant, an annealing process may be performed to activate the dopants. The annealing may utilize rapid thermal annealing (RTA), spike annealing, millisecond annealing, and/or laser annealing. In alternative embodiments, the LDD portions may be formed after gate spacers (as shown in FIG. 2) are formed.

Figure 2:
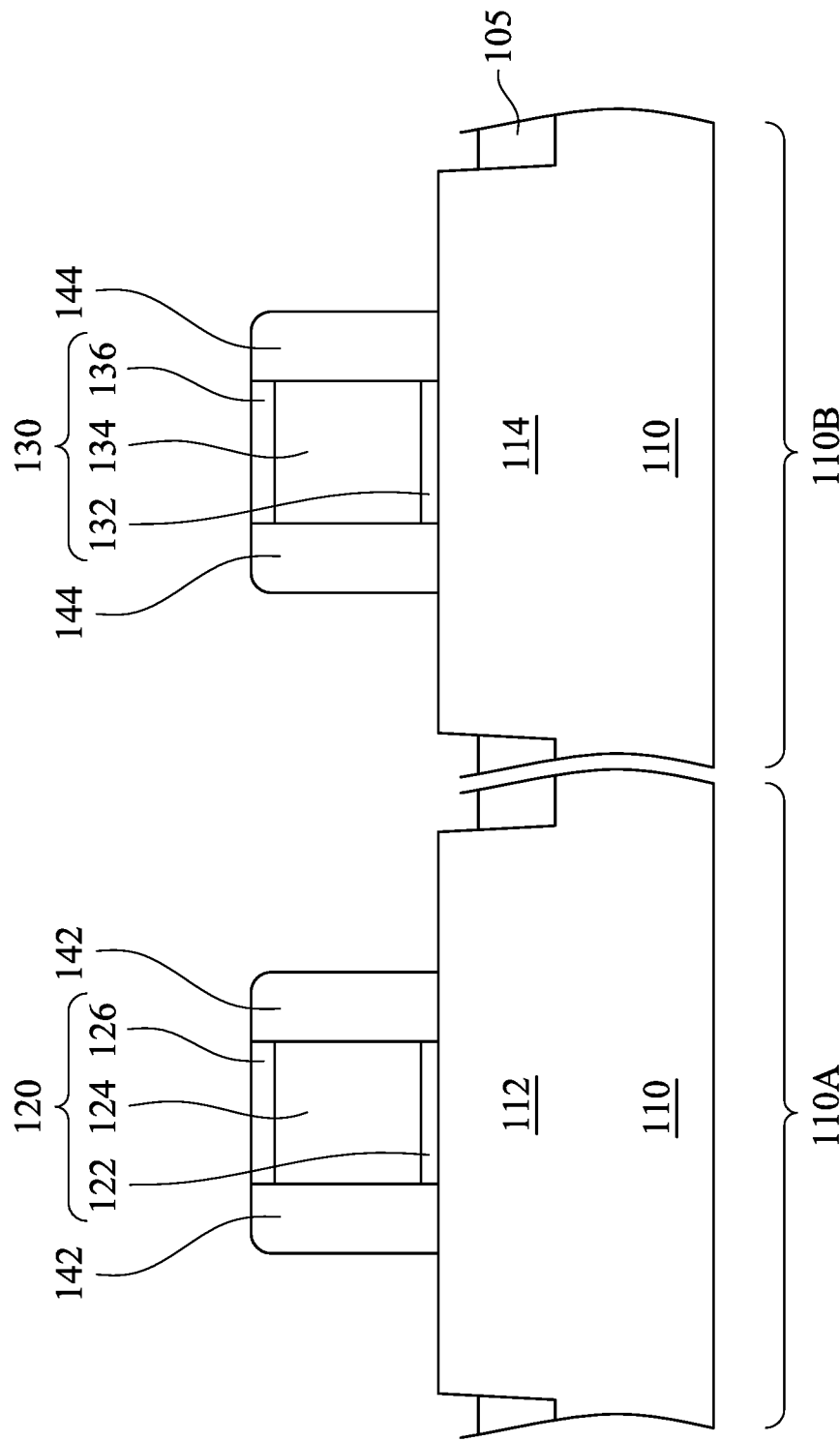

Reference is made to FIG. 2. A pair of gate spacers 142 is formed on the substrate 110 and along gate structure 120, and a pair of gate spacers 144 is formed on the substrate 110 and along the gate structure 130. In some embodiments, the gate spacers 142 and 144 may include silicon oxide, silicon nitride, silicon oxynitride, silicon carbide, silicon carbonitride, silicon oxycarbonitride, silicon oxycarbide or other suitable material. The gate spacers 142 and 144 may include a single layer or multilayer structure. To form the gate spacers 142 and 144, a blanket layer may be formed on the substrate 110 by CVD, PVD, atomic layer deposition (ALD), or other suitable technique. Then, an anisotropic etching is performed on the blanket layer to form the gate spacers 142 and 144 respectively on opposite sides of the dummy gate structures 120 and 130. In some embodiments, the gate spacers 142 and 144 are used to offset subsequently formed doped portions, such as source/drain portions. The gate spacers 142 and 144 may further be used for designing or modifying the source/drain portion (junction) profile.

Figure 3:
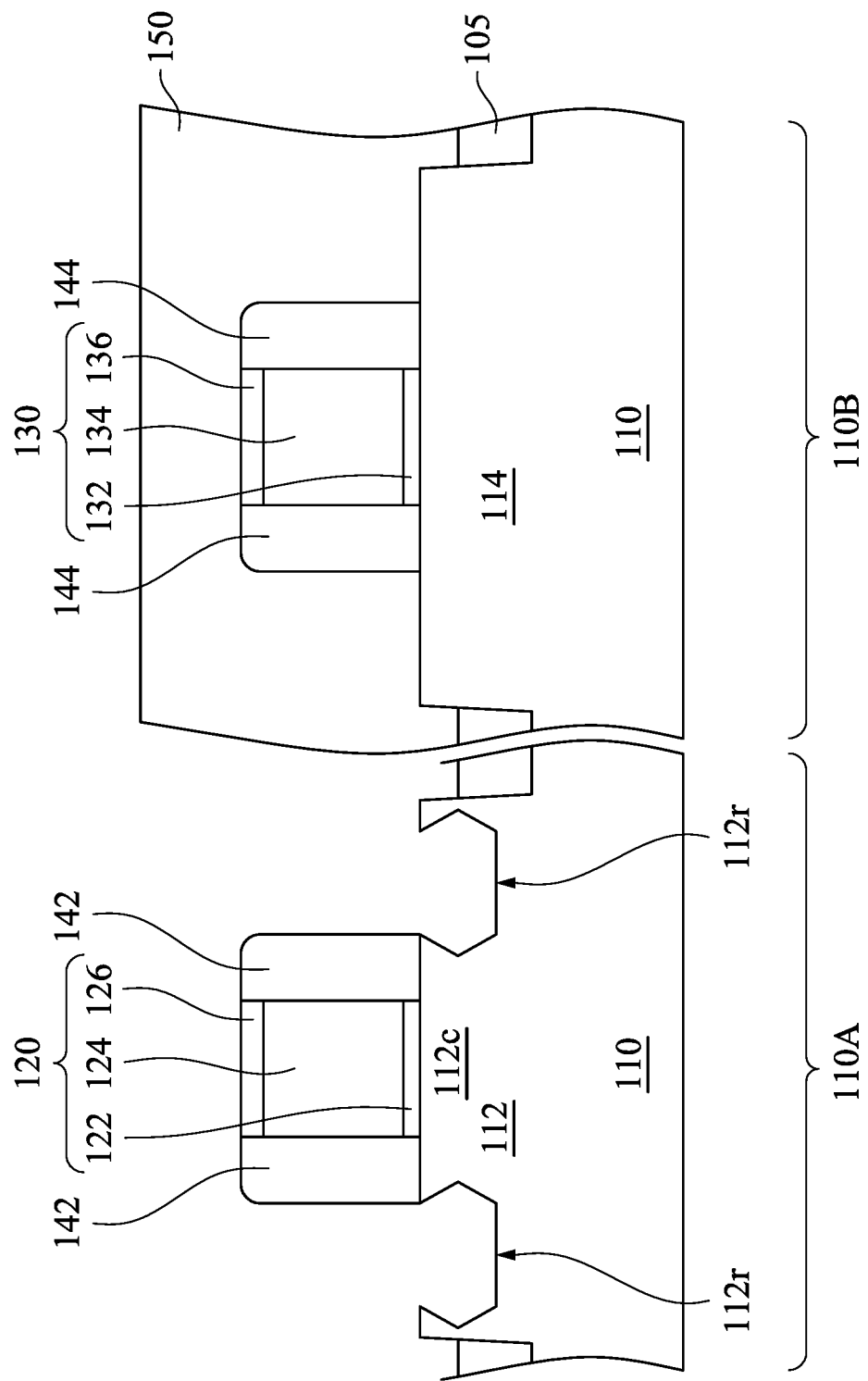

Reference is made to FIG. 3. A mask 150 is formed over the second portion 110B of the substrate 110 while the first portion 110A is exposed. The mask 150 protects the second portion 110B during subsequent processing of the first portion 110A. The mask 150 may be a photoresist, a hard mask, such as silicon nitride, the like, or a combination thereof. The mask 150 is then patterned by an acceptable photolithography process or the like.

Next, on the first portion 110A exposed by the mask 150, portions of the semiconductor fin 112 exposed by the gate structure 120 and the gate spacers 142 are removed (or recessed) to form recesses 112r in the substrate 110. Any suitable amount of material may be removed. The remaining semiconductor fin 112 has a channel portion 112c between the recesses 112r. The channel portion 112c is wrapped by the gate structure 120. In some embodiments, the recesses 112r can be formed to have a substantially diamond-shaped profile, as shown in FIG. 3. That is, some sidewalls of the recesses 112r are extended towards the channel portion 112c underneath the gate spacers 142. In some embodiments, the recesses 112r can be formed to have a substantially U-shaped profile (not shown), and a sidewall of the recess 112r can be substantially aligned with the edge (or outer boundary) of the gate spacer 142.

Formation of the recesses 112r may include a dry etching process, a wet etching process, or combination dry and wet etching processes. In some embodiments, the substantially diamond-shaped recesses 112r can be formed with an etching process that includes dry etching and wet etching processes where etching parameters thereof are tuned (such as etchants used, etching temperature, etching solution concentration, etching pressure, source power, radio frequency (RF) bias voltage, RF bias power, etchant flow rate, and other suitable parameters) to achieve the predetermined recess profile. After the etching process, a pre-cleaning process may be performed to clean the recesses 112r with hydrofluoric acid (HF) or other suitable solution in some embodiments.

Figure 4:
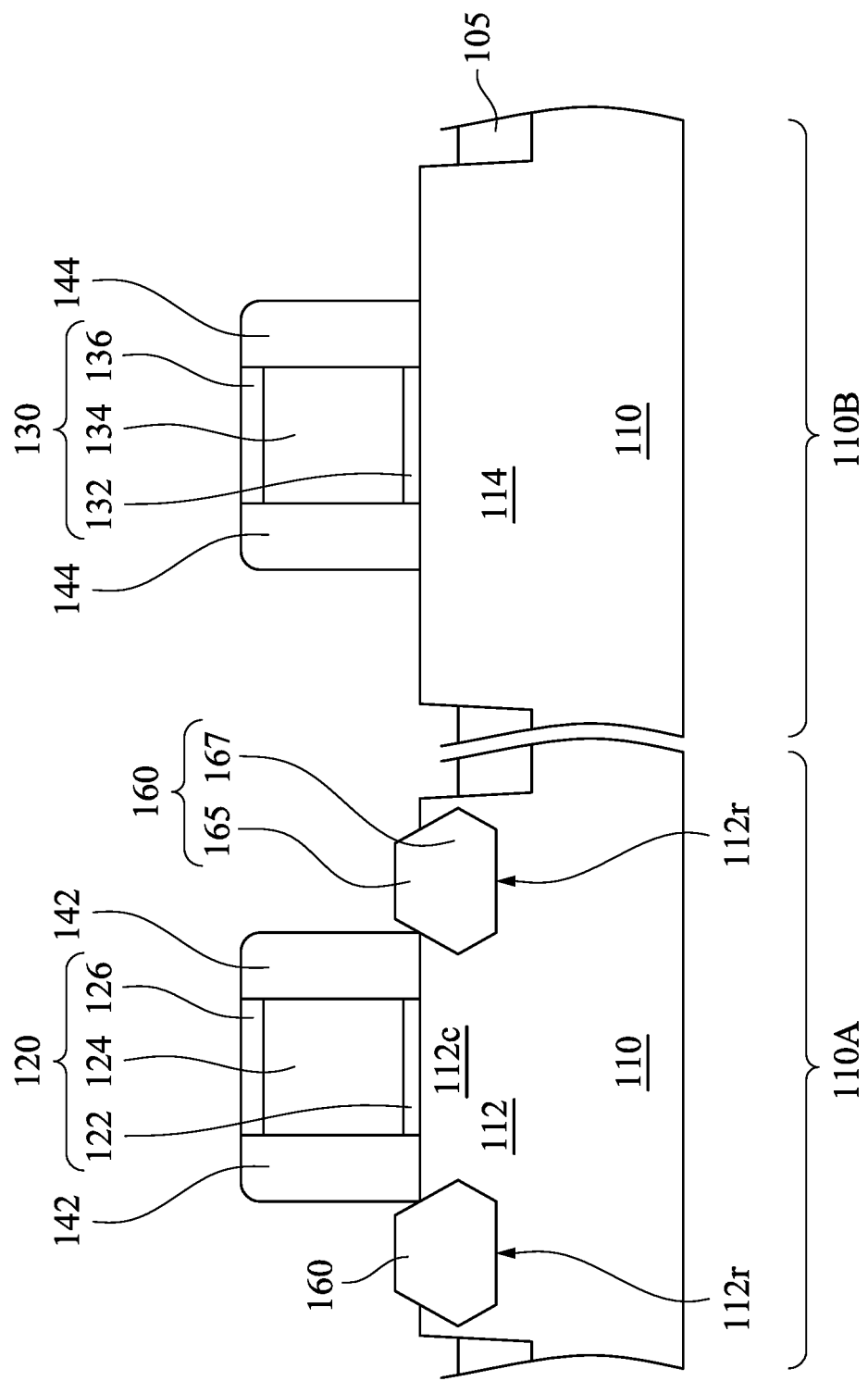

Reference is made to FIG. 4. A plurality of epitaxy features 160 are respectively formed in the recesses 112r. The epitaxy features 160 may be formed using one or more epitaxy or epitaxial (epi) processes, such that Si features, silicon phosphate (SiP) features, silicon carbide (SiC) features, and/or other suitable features suitable for serving as source/drain portions of the n-type device can be formed in a crystalline state on the semiconductor fin 112 in the first portion 110A. In some embodiments, the epitaxy features 160 include raised portions 165 and embedded portions 167 underlying the respective raised portions 165. The raised portions 165 are raised with respect to the semiconductor fin 112, and the embedded portions 167 are embedded in the semiconductor fin 112. In some embodiments, the lattice constants of the epitaxy features 160 are different from the lattice constant of the semiconductor fin 112, so that the channel portion 112c of the semiconductor fins 112 can be strained or stressed by the epitaxy features 160 to improve carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 112. In some embodiments, the patterned mask 150 protecting the second portion 110B can be removed before or after the epitaxy processes.

Figure 5:
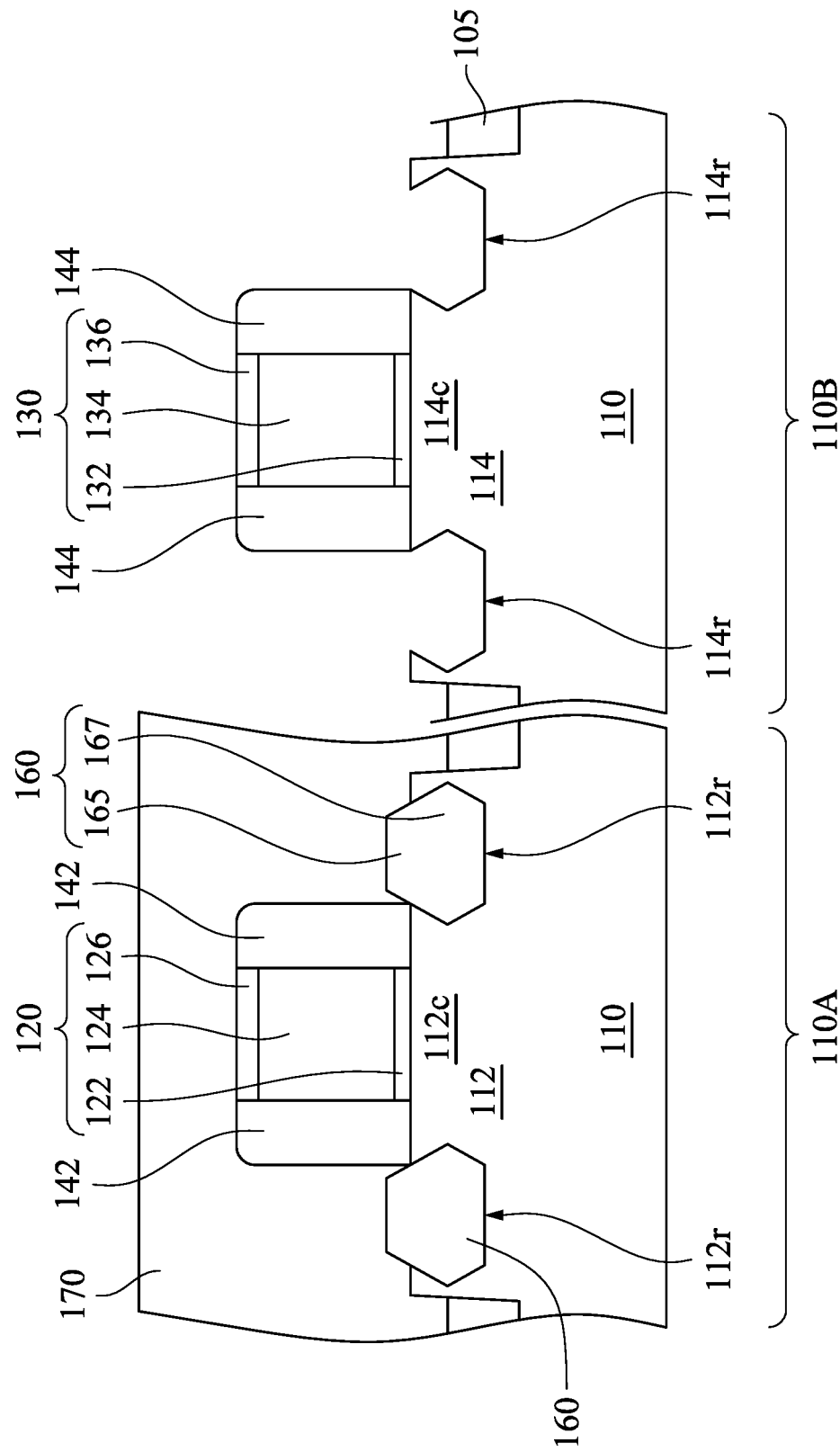

Reference is made to FIG. 5. A mask 170 is formed over the first portion 110A of the substrate 110 while the second portion 110B is exposed. The mask 170 protects the first portion 110A during subsequent processing of the second portion 110B. The mask 170 may be a photoresist, a hard mask, such as silicon nitride, the like, or a combination thereof. The mask 170 is then patterned by an acceptable photolithography process or the like.

Next, on the second portion 110B exposed by the mask 170, portions of the semiconductor fin 114 exposed by the gate structure 130 and the gate spacers 144 are removed (or recessed) to form recesses 114r in the substrate 110. Any suitable amount of material may be removed. The remaining semiconductor fin 114 has a channel portion 114c between the recesses 114r. The channel portion 114c is wrapped by the gate structure 130. In some embodiments, the recesses 114r can be formed to have a substantially diamond-shaped profile, as shown in FIG. 5. That is, some sidewalls of the recesses 114r are extended towards the channel portion 114c underneath the gate spacers 144. In some embodiments, the recesses 114r can be formed to have a substantially U-shaped profile, and a sidewall of the recess 114r can be substantially aligned with the edge (or outer boundary) of the gate spacer 144.

Formation of the recesses 114r may include a dry etching process, a wet etching process, or combination dry and wet etching processes. In some embodiments, the substantially diamond-shaped recesses 114r can be formed with an etching process that includes dry etching and wet etching processes where etching parameters thereof are tuned (such as etchants used, etching temperature, etching solution concentration, etching pressure, source power, radio frequency (RF) bias voltage, RF bias power, etchant flow rate, and other suitable parameters) to achieve the predetermined recess profile. After the etching process, a pre-cleaning process may be performed to clean the recesses 114r with hydrofluoric acid (HF) or other suitable solution in some embodiments.

Figure 6:
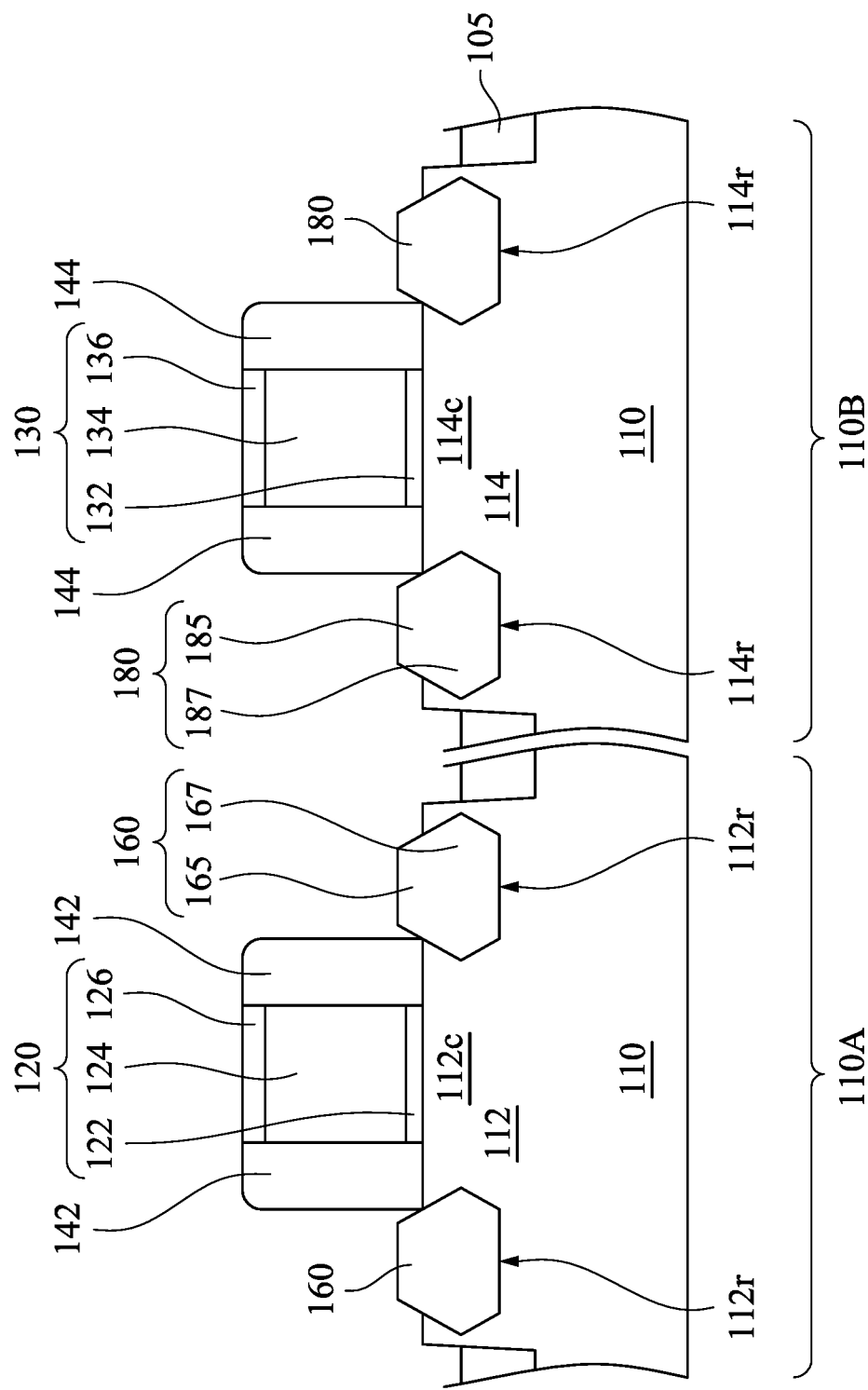

Reference is made to FIG. 6. A plurality of epitaxy features 180 are respectively formed in the recesses 114r. The epitaxy features 180 may be formed using one or more epitaxy or epitaxial (epi) processes, such that Si features, SiGe features and/or other suitable features suitable for serving as source/drain portions of the p-type device can be formed in a crystalline state on the semiconductor fin 114 in the second portion 110B. In some embodiments, the epitaxy features 180 include raised portions 185 and embedded portions 187 underlying the respective raised portions 185. The raised portions 185 are raised with respect to the semiconductor fin 114, and the embedded portions 187 are embedded in the semiconductor fin 114. In some embodiments, the lattice constants of the epitaxy features 180 are different from the lattice constant of the semiconductor fin 114, so that the channel portion 114c of the semiconductor fin 114 can be strained or stressed by the epitaxy features 180 to improve carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 114. In some embodiments, the patterned mask 170 protecting the first portion 110A can be removed before or after the epitaxy processes.

Figure 7:
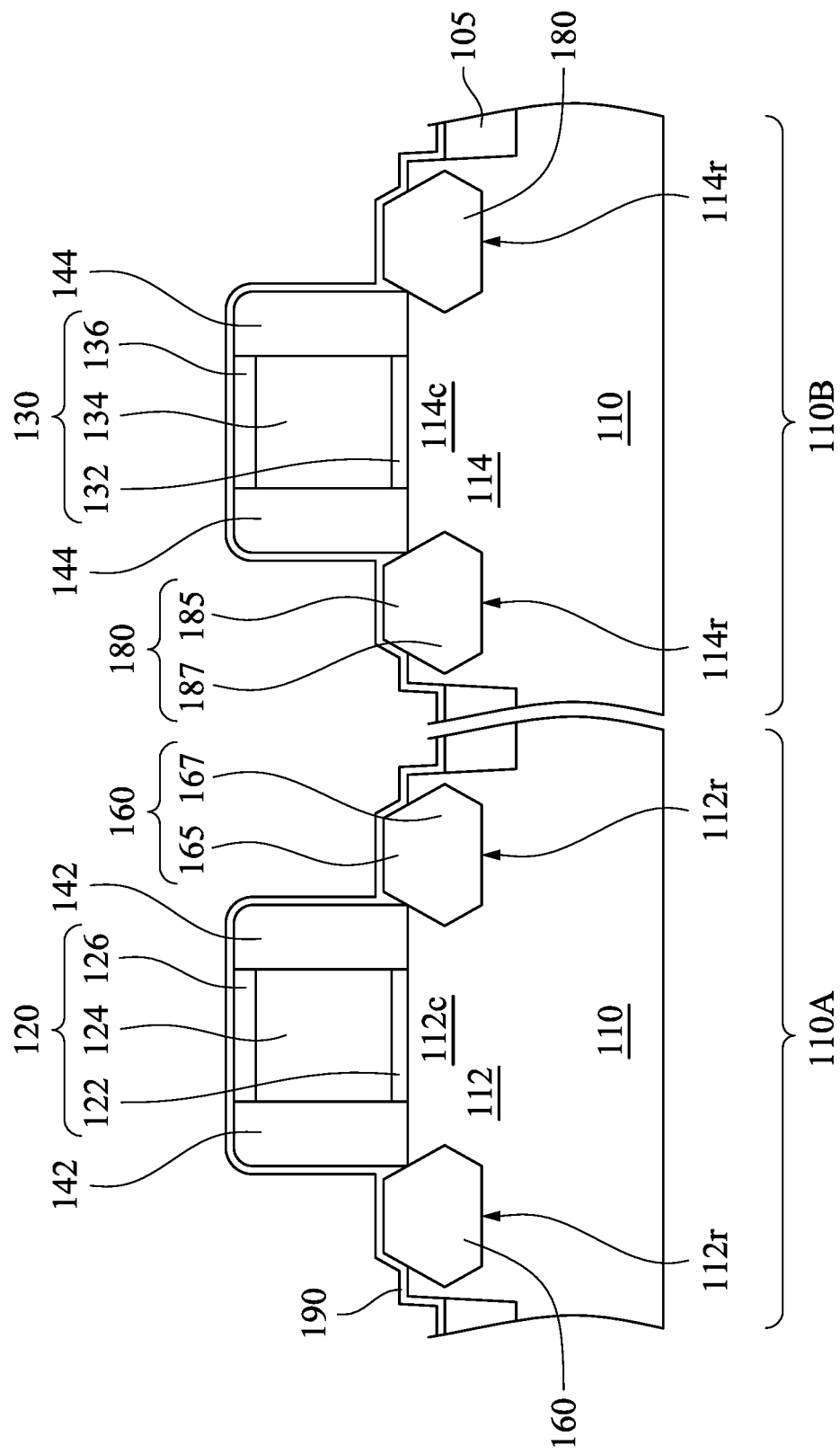

Reference is made to FIG. 7. A screening layer 190 may be blanket formed on the structure shown in FIG. 6. That is, the screening layer 190 caps the semiconductor fins 112 and 114, the gate structures 120 and 130, the gate spacers 142 and 144, and the epitaxy features 160 and 180. The screening layer 190 may be used for implantation screening and reduction of the channeling effect during the subsequent implantation. The screening layer 190 may be an oxide layer, ranging from about 10 angstroms to about 50 angstroms in thickness, as examples. Formation of the screening oxide layer 190 may exemplarily include deposition, such as PVD or CVD. The screening layer 190 can be omitted in some embodiments.

Figure 8:
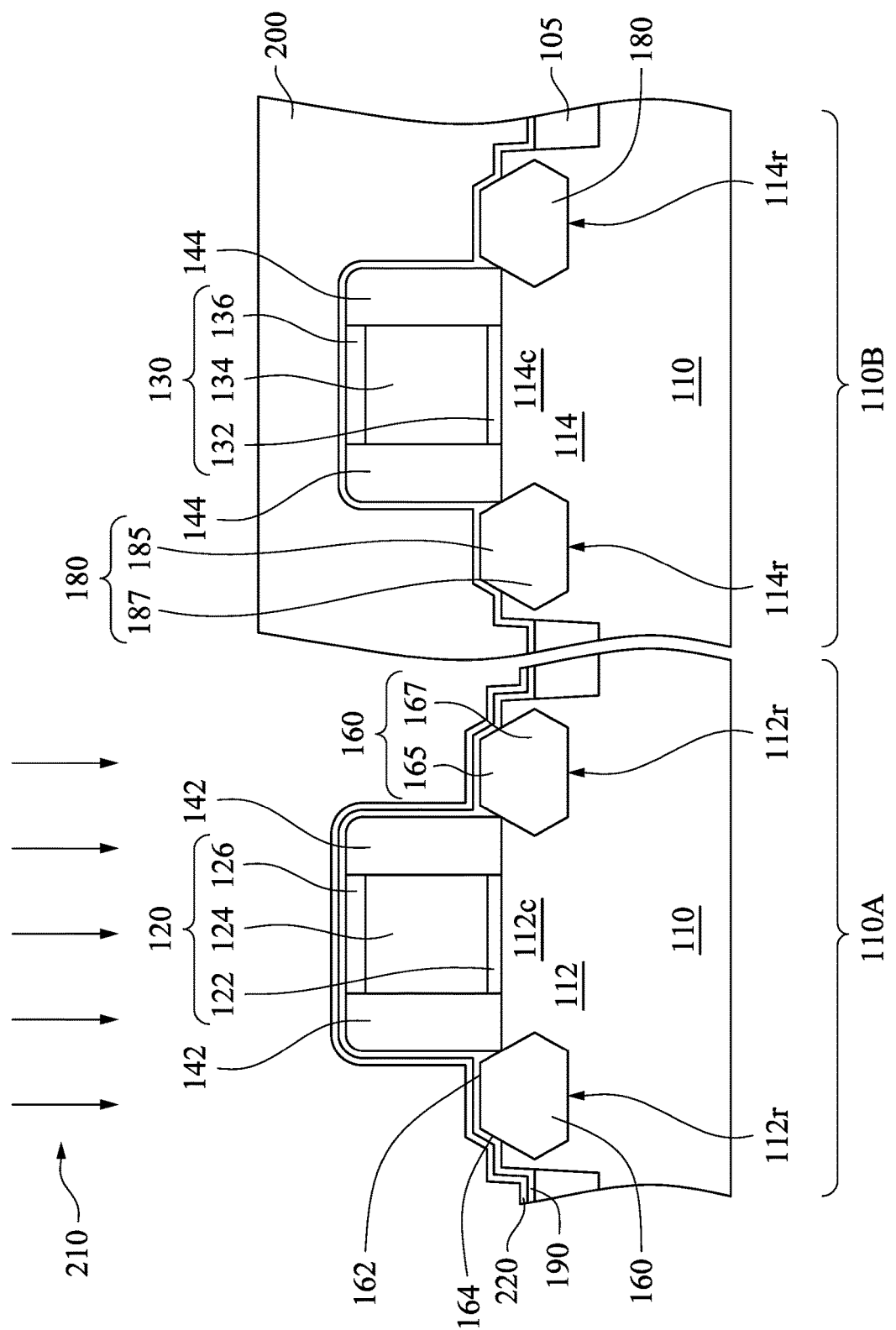

Reference is made to FIG. 8. A mask 200 is formed over the second portion 110B of the substrate 110 while the first portion 110A is exposed. The mask 200 protects the second portion 110B during subsequent processing of the first portion 110A. In some embodiments, the mask 200 may be an oxide mask, such as silicon oxide, the like, or a combination thereof. Employing the oxide mask may obviate some issues caused by photoresist mask which subsequently undergoes a plasma doping process. These issues may include, for example, photoresist scum on the second portion 110B due to damage of the photoresist mask caused by plasma. The mask 200 can be patterned by an acceptable photolithography process or the like to expose the first portion 110A.

Figure 17:
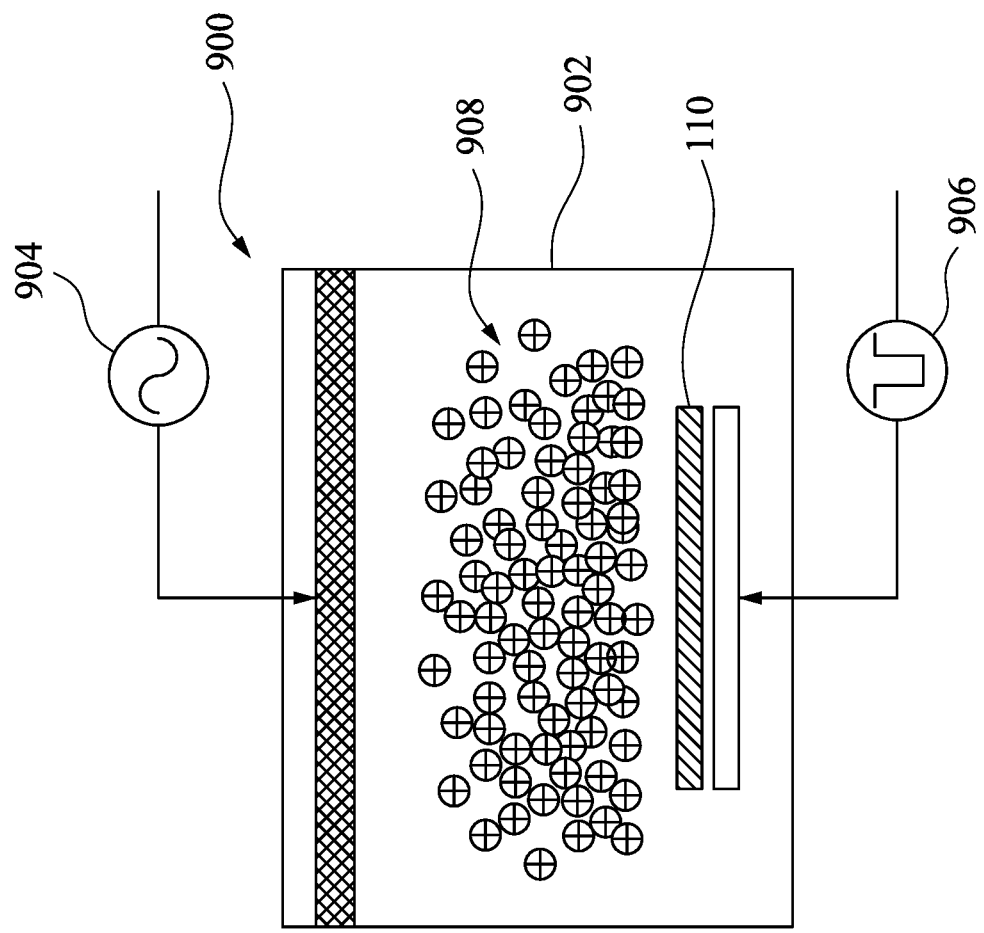
FIG. 17 illustrates an apparatus for performing a plasma doping process in accordance with some embodiments of the present disclosure.

Thereafter, a plasma doping (PLAD) process 210 is performed to the substrate 110 and forms a dopant source layer 220 at least on the first portion 110A. Stated differently, the dopant source layer 220 may be deposited at least on the first portion 110A using a plasma-assisted process. The plasma doping process 210 can be performed in an apparatus 900 as shown in FIG. 17. The apparatus 900 includes a chamber 902, in which the substrate 110 is placed. The apparatus 900 can include power sources 904 and 906 that are electrically coupled with electrodes (not labeled) located in the chamber 902. In some embodiments, the power source 904 can be a radio frequency (RF) power source with a programmable pulse modulation function. The power source 906 can be a pulsed direct current (DC) or RF power source for providing a bias voltage on the substrate 110. In some embodiments, the power sources 904 and 906 can be operated independently from each other. The power sources 904 and 906 can be programmed to be independently powered on and off without affecting the other.

Referring again to FIG. 8, the plasma doping process 210 can form the dopant source layer 220 capping the isolation dielectric 105, the semiconductor fin 112, the gate structure 120, the gate spacers 142 and the epitaxy features 160. Depending on the conductivity type of the FinFET, in some embodiments, the dopant source layer 220 includes n-type dopants (impurities) or p-type dopants (impurities). For example, in the embodiments where the first portion 110A is for forming n-type FinFETs, the dopant source layer 220 may include n-type dopants, such as phosphorous, arsenic, other group V elements, or combinations thereof. In some embodiments, the atomic percentage of the dopant in the dopant source layer 220 may be substantially equal to or greater than about 90 percent. In some embodiments, the dopant source layer 220 can be a substantially pure dopant layer.

Referring again to FIG. 17, plasma 908 can be generated from a process gas in the chamber 902. The process gas can include at least one n-type dopant gas such as $AsH_3$, $PH_3$, other n-type dopant gases, or combinations thereof, and at least one dilution gas such as Xe, Ar, He, Ne, Hz, other dilution gases, or combinations thereof, depending on the predetermined composition of dopant source layer 220. In some embodiments, the plasma doping process 210 can have a bias voltage ranging from about 200 eV to about 2000 eV, a pressure ranging from about 4 mTorr to about 20 mTorr, and an inductively coupled plasma (ICP) power ranging from about 50 Watt to about 1 KWatt, as examples. In some embodiments, the RF power source 904 may be turned on continuously during the entire period for forming dopant source layer 220. In alternative embodiments, the RF power source 904 is pulsed (in an on and off pattern), and the pulsed RF power source 904 may be advantageous to improve the conformity of dopant source layer 220. The DC bias voltage provided by DC power source 906 during the formation of dopant source layer 220 may also be pulsed in some embodiments.

In some embodiments, the profile of the dopant source layer 220 on the epitaxy features 160 can be modified by changing the bias voltage provided by the power source 906. For example, in some embodiments using a high bias voltage, e.g., about 1.5 KeV, the thickness of the dopant source layer 220 on the top surfaces 162 of the epitaxy features 160 may be greater than that on the sidewalls 164 of the epitaxy features 160. In other embodiments using a low bias voltage, e.g., substantially equal to or less than about 0.5 KeV, the thickness of the dopant source layer 220 on the top surfaces 162 of the epitaxy features 160 can be substantially equal to that on the sidewalls 164 of the epitaxy features 160. In some embodiments, with zero DC bias voltage provided by the DC power source 906, the directionality of the plasma doping process is reduced, and hence the dopant source layer 220 may be deposited over the first portion 110A as a separate layer, rather being directly implanted into the epitaxy features 160 in the first portion 110A.

Figure 9:
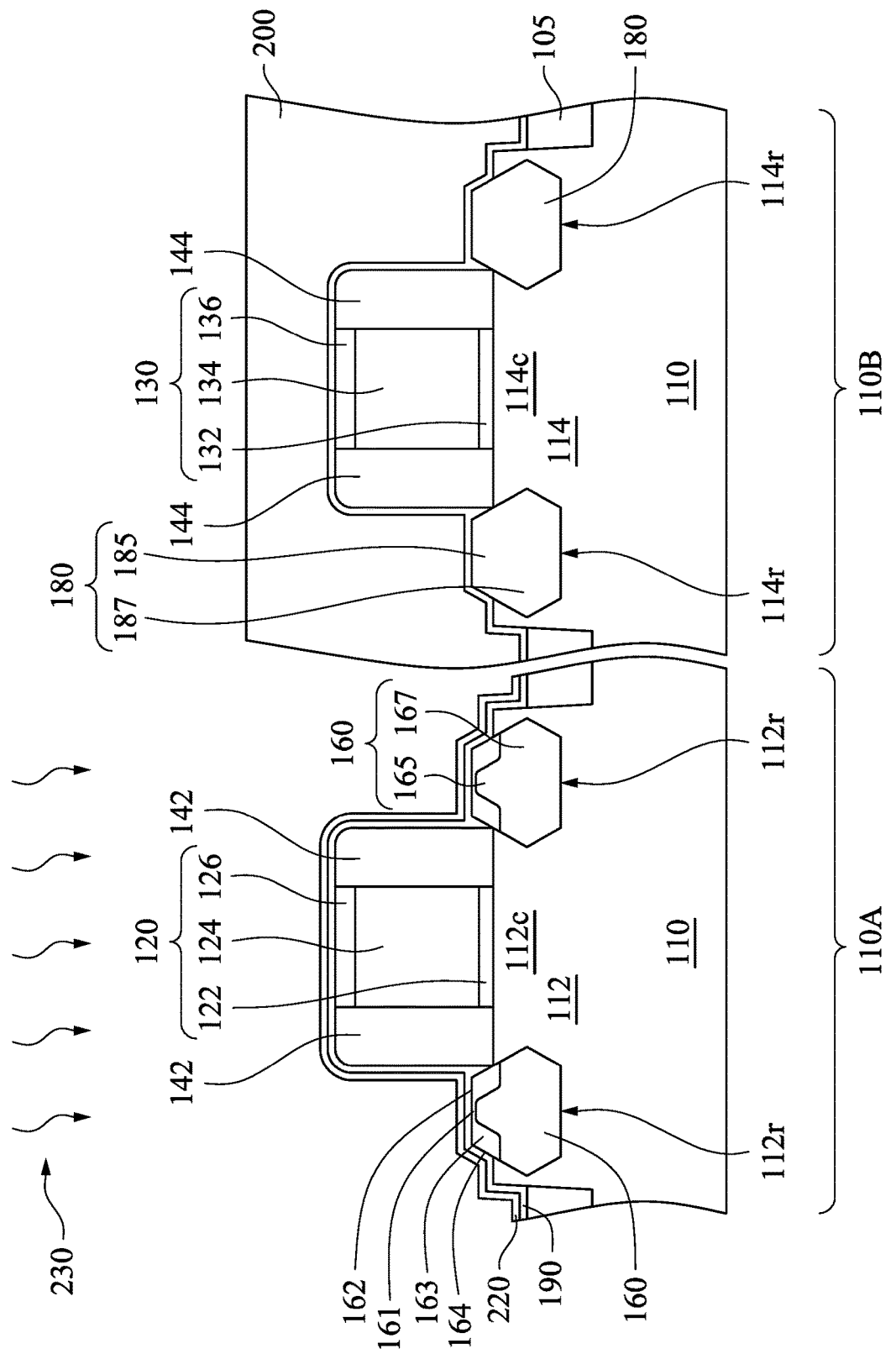

Next, as shown in FIG. 9, one or more annealing processes 230 are performed on the substrate 110. The annealing process 230 can drive dopants from the dopant source layer 220 to diffuse into the epitaxy features 160 through the top surfaces 162 and the sidewalls 164, forming doped top central portions 161 and doped corner or edge portions 163 therein. In other words, the top central portions 161 and corner portions 163 may have substantially the same impurity in some embodiments. The annealing process 230 also activates the dopants in the epitaxy features 160. In some embodiments, (111) facets of the epitaxy features 160 can serve as the sidewalls 164. As n-type dopants are introduced during the plasma doping process 210, the epitaxy features 160 undergo the plasma doping process 210 and the annealing process 230 can serve as n-type doped source/drain portions for the semiconductor fin 112. The combination of the plasma doping process 210 and the annealing process 230 may cause the epitaxy features 160 to have impurity concentration ranging from about 0.01 percent to about 2 percent according to some embodiments. In some embodiments, the combination of the plasma doping process 210 and the annealing process 230 may cause the epitaxy features 160 to have impurity concentration ranging from about 0.05 percent to about 1 percent. These impurity concentrations may be high enough to reduce the contact resistance between the epitaxy features 160 and subsequently formed source/drain contact plugs. The annealing process 230 may include rapid thermal annealing (RTA), spike annealing, millisecond annealing, and/or laser annealing processes, as examples. The annealing process 230 performed at this stage can induce the solid phase diffusion of dopants from the dopant source layer 220 into the epitaxy features 160. The dopants may have higher solid solubility in the epitaxy features 160 than in the dielectric features, such as the isolation dielectric 105 and/or the gate spacers 142. This solid solubility difference may cause the isolation dielectric 105 and/or the gate spacers 142 acting as diffusion barriers, so that dopants in portions of the dopant source layer 220 on the isolation dielectric 105 and/or the gate spacers 142 can be diffused into some portions of the epitaxy features 160 that neighbor the isolation dielectric 105 and/or the gate spacers 142.

For example, the isolation dielectric 105 is closer to the corner portions 163 than the top central portions 161, and the dopants in the dopant source layer 220 on the isolation dielectric 105 can thus be diffused into the corner portions 163, rather than the top central portions 161. Moreover, the gate spacers 142 are closer to the corner portions 163 than the top central portions 161, and the dopants in the dopant source layer 220 on the gate spacers 142 can thus be diffused into the corner portions 163 as well. As such, portions of the dopant source layer 220 on the corner portions 163 can serve as diffusion sources for the corner portions 163, and moreover, portions of the dopant source layer 220 on the isolation dielectric 105 and/or the gate spacers 142 can also serve as diffusion sources for the corner portions 163. On the other hand, portions of the dopant source layer 220 on the top central portions 161 serve as diffusion sources for the respective top central portions 161. Therefore, the corner portions 163 have diffusion sources more than that of the top central portions 161, and hence the corner portions 163 may have impurity concentrations higher than that of the top central portions 161 in some embodiments. For example, a ratio of the impurity concentration of the corner portion 163 to that of the top central portion 161 is greater than 105%. Furthermore, the corner portions 163 may have dopant depths deeper than that of the top central portions 161 due to that the corner portions 163 have diffusion sources more than that of the top central portions 161. For example, a ratio of the dopant depth of the corner portion 163 to that of the top central portion 161 is greater than 105%. Stated differently, the corner portions 163 having higher impurity concentrations may be thicker than the top central portions 161 having lower impurity concentrations. The dopant depth of the corner portion 163 can be measured from a periphery (or outer boundary) of the corner portion 163 toward an interior of the epitaxy feature 160. Similarly, the dopant depth of the top central portion 161 can be measured from a periphery of the top central portion 161 toward an interior of the epitaxy feature 160.

In an epitaxy feature 160, corner portions 163 having higher impurity concentrations and/or deeper dopant depth may be respectively present on opposite sides of the top central portion 161 according to some embodiments. That is, a top central portion 161 of an epitaxy feature 160 is present between or surrounded by corner portions 163 of the same epitaxy feature 160, and these corner portions 163 have higher impurity concentrations and/or dopant depths than this top central portion 161.

In some embodiments, the sidewalls 164 of the epitaxy features 160 are present on the corner portions 163, so that the isolation dielectric 105 and/or the gate spacers 142 are closer to the sidewalls 164 than the top central portions 161. Therefore, the sidewalls 164 may have impurity concentrations higher than that of the top central portions 161. In some embodiments, the isolation dielectric 105 and/or the gate spacers 142 are closer to the sidewalls 164 than the top surfaces 162, and therefore, the sidewalls 164 may have impurity concentrations higher than that of central regions of the top surfaces 162.

In some embodiments, the corner portions 163 having higher impurity concentrations and/or higher dopant depths are at least partially present in the raised portions 165 of the epitaxy features 160. That is, the corner portions 163 having higher impurity concentrations and/or higher dopant depths are at least partially raised with respect to the semiconductor fin 112. Moreover, the corner portions 163 having the higher impurity concentrations and/or higher dopant depths may further extend into the embedded portions 167 of the epitaxy features 160. That is, the corner portions 163 having higher impurity concentrations and/or higher dopant depths are at least partially present in the recesses 112r of the semiconductor fins 114. In other words, portions of the corner portions 163 lower than the top central portions 161 have impurity concentrations higher than that of the top central portions 161. Stated differently, portions of the epitaxy features 160 in positions lower than top surface of the semiconductor substrate 110 has an impurity concentration higher than that of the top central portions 161 of epitaxy features. In some embodiments, facets 164 of the epitaxy features 160 with higher impurity concentration than that of the top central portions 161 extend into the semiconductor substrate 110.

Figure 10:
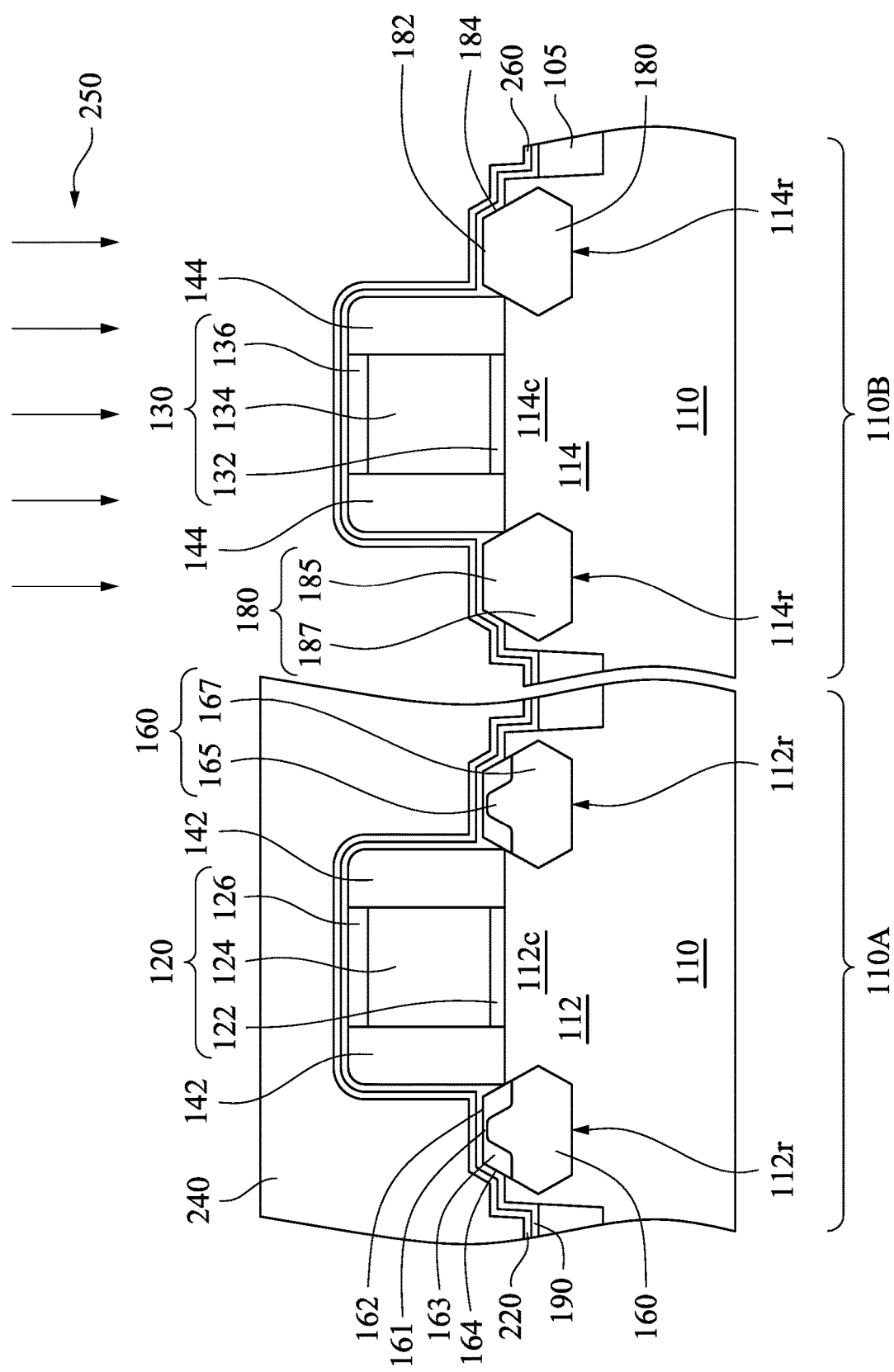

Reference is made to FIG. 10. The mask 200 covering the second portion 110B of the substrate 110 is removed. In the embodiments where the mask 200 is an oxide mask such as silicon oxide, an exemplary method of removing the mask 200 may be wet etching, such as dipping the substrate 110 in a wet solution comprising HF or by a dry etching process.

Thereafter, a mask 240 is formed over the first portion 110A of the substrate 110 while the second portion 110B is exposed. The mask 240 protects the first portion 110A during subsequent processing of the second portion 110B. In some embodiments, the mask 240 may be an oxide mask, such as silicon oxide, the like, or a combination thereof. Employing the oxide mask may obviate some issues caused by photoresist mask which subsequently undergoes a plasma doping process. These issues may include, for example, photoresist scum on the first portion 110A due to damage of the photoresist mask caused by plasma. The mask 240 can be patterned by an acceptable photolithography process or the like to expose the second portion 110B.

Next, a plasma doping (PLAD) process 250 is performed to the substrate 110 and forms a dopant source layer 260 at least on the second portion 110B. Stated differently, the dopant source layer 260 may be deposited at least on the second portion 110B using a plasma-assisted process. Similar to the plasma doping process 210 performed at the stage shown in FIG. 8, the plasma doping process 250 can also be performed in the apparatus 900 as shown in FIG. 17. The plasma doping process 250 can form the dopant source layer 260 over the isolation dielectric 105, the semiconductor fin 114, the gate structure 130, the gate spacers 144 and the epitaxy features 180. Depending on the conductivity type of the FinFET, in some embodiments, the dopant source layer 260 comprises n-type dopants (impurities) or p-type dopants (impurities). For example, in the embodiments where the second portion 110B is for forming p-type FinFETs, the dopant source layer 260 may include p-type dopants, such as boron, indium, other group III elements, or combinations thereof. In some embodiments, the atomic percentage of the dopant in the dopant source layer 260 may be substantially equal to or greater than about 90 percent. In some embodiments, the dopant source layer 260 can be a substantially pure dopant layer.

Referring again to FIG. 17, plasma 908 can be generated from a process gas in the chamber 902. The process gas can include at least one p-type dopant gas such as $B_2H_6$, $BF_3$, other p-type dopant gases, or combinations thereof, and at least one dilution gas such as Xe, Ar, He, Ne, Hz, other dilution gases, or combinations thereof, depending on the predetermined composition of dopant source layer 260. In some embodiments, the plasma doping process 250 can have a bias voltage ranging from about 500 eV to about 3000 eV, a pressure ranging from about 4 mTorr to about 20 mTorr, and an inductively coupled plasma (ICP) power ranging from about 50 Watt to about 1 KWatt, as examples. In some embodiments, the RF power source 904 may be turned on continuously during the entire period for forming dopant source layer 260. In alternative embodiments, the RF power source 904 is pulsed (in an on and off pattern), and the pulsed RF power source 904 may be advantageous to improve the conformity of dopant source layer 260. The DC bias voltage provided by DC power source 906 during the formation of dopant source layer 260 may also be pulsed in some embodiments.

In some embodiments, the profile of the dopant source layer 260 on the epitaxy features 180 can be modified by changing the bias voltage provided by the power source 906. For example, in some embodiments using a high bias voltage, e.g., about 1.5 KeV, the thickness of the dopant source layer 260 on the top surfaces 182 of the epitaxy features 180 may be greater than that on the sidewalls 184 of the epitaxy features 180. In other embodiments using a low bias voltage, e.g., substantially equal to or less than about 0.5 KeV, the thickness of the dopant source layer 260 on the top surfaces 182 of the epitaxy features 180 can be substantially equal to that on the sidewalls 184 of the epitaxy features 180. In some embodiments, with zero DC bias voltage provided by the DC power source 906, the directionality of the plasma doping process is reduced, and hence the dopant source layer 260 may be deposited over the second portion 110B as a separate layer, rather being directly implanted into the epitaxy features 180 in the second portion 110B.

Figure 11:
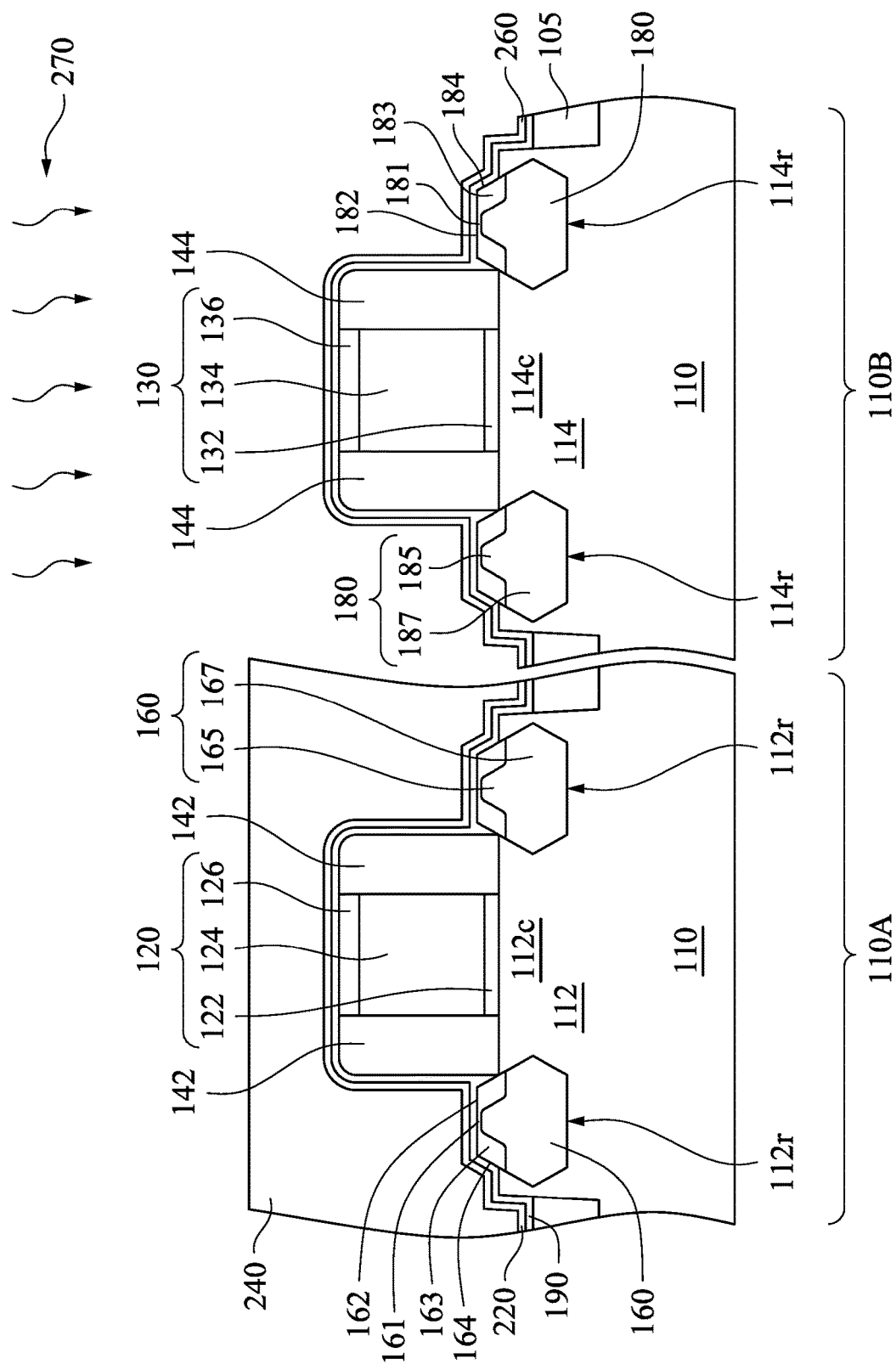

Next, as shown in FIG. 11, one or more annealing processes 270 are performed on the substrate 110. The annealing process 270 can drive dopants from the dopant source layer 260 to diffuse into the epitaxy features 180 through the top surfaces 182 and the sidewalls 184, forming doped top central portions 181 and doped corner or edge portions 183 therein. Therefore, the top central portions 181 and corner portions 183 may have substantially the same impurity. In some embodiments, the impurity of epitaxy features 180 is different from the impurity of the epitaxy features 160. The annealing process 270 also activates the dopants in the epitaxy features 180. As p-type dopants are introduced during the plasma doping process 250, the epitaxy features 180 undergo the plasma doping process 250 and the annealing process 270 can serve as p-type doped source/drain portions for the semiconductor fin 114. The combination of the plasma doping process 250 and the annealing process 270 may cause the epitaxy features 180 to have impurity concentration ranging from about 0.01 percent to about 2 percent according to some embodiments. In some embodiments, the combination of the plasma doping process 250 and the annealing process 270 may cause the epitaxy features 180 to have impurity concentration ranging from about 0.05 percent to about 1 percent. These impurity concentrations may be high enough to reduce the contact resistance between the epitaxy features 180 and subsequently formed source/drain contact plugs. The annealing process 270 may include rapid thermal annealing (RTA), spike annealing, millisecond annealing, and/or laser annealing processes, as examples. The annealing process 270 performed at this stage can induce the solid phase diffusion of dopants from the dopant source layer 260 into the epitaxy features 180. The dopants may have higher solid solubility in the epitaxy features 180 than in the dielectric features, such as the isolation dielectric 105 and/or the gate spacers 144. This solid solubility difference may cause the isolation dielectric 105 and/or the gate spacers 144 acting as diffusion barriers, so that dopants in portions of the dopant source layer 260 on the isolation dielectric 105 and/or the gate spacers 144 can be diffused into some portions of the epitaxy features 180 that neighbor the isolation dielectric 105 and/or the gate spacers 144.

For example, the isolation dielectric 105 is closer to the corner portions 183 than the top central portions 181, and the dopants in the dopant source layer 260 on the isolation dielectric 105 can thus be diffused into the corner portions 183, rather than the top central portions 181. Moreover, the gate spacers 144 are closer to the corner portions 183 than the top central portions 181, and the dopants in the dopant source layer 260 on the gate spacers 144 can thus be diffused into the corner portions 183 as well. As such, portions of the dopant source layer 260 on the corner portions 183 can serve as diffusion sources for the corner portions 183, and moreover, portions of the dopant source layer 260 on the isolation dielectric 105 and/or the gate spacers 144 can also serve as diffusion sources for the corner portions 183. On the other hand, portions of the dopant source layer 260 on the top central portions 181 serve as diffusion sources for the respective top central portions 181. Therefore, the corner portions 183 have diffusion sources more than that of the top central portions 181, and hence the corner portions 183 may have impurity concentrations higher than that of the top central portions 181 in some embodiments. For example, a ratio of the impurity concentration of the corner portion 183 to that of the top central portion 181 is greater than 105%. Furthermore, the corner portions 183 may have dopant depths deeper than that of the top central portions 181 due to that the corner portions 183 have diffusion sources more than that of the top central portions 181. For example, a ratio of the dopant depth of the corner portion 183 to that of the top central portion 181 is greater than 105%. Stated differently, the corner portions 183 having higher impurity concentrations may be thicker than the top central portions 181 having lower impurity concentrations. The dopant depth of the corner portion 183 can be measured from a periphery of the corner portion 183 toward an interior of the epitaxy feature 180. Similarly, the dopant depth of the top central portion 181 can be measured from a periphery of the top central portion 181 toward an interior of the epitaxy feature 180.

In an epitaxy feature 180, corner portions 183 having higher impurity concentrations and/or deeper dopant depth may be respectively present on opposite sides of the top central portion 181 according to some embodiments. That is, a top central portion 181 of an epitaxy feature 180 is present between or surrounded by corner portions 183 of the same epitaxy feature 180, and these corner portions 183 have higher impurity concentrations and/or dopant depths than this top central portion 181.

In some embodiments, the sidewalls 184 of the epitaxy features 180 are present on the corner portions 183, so that the isolation dielectric 105 and/or the gate spacers 144 are closer to the sidewalls 184 than the top central portions 181. Therefore, the sidewalls 184 may have impurity concentrations higher than that of the top central portions 181. In some embodiments, the isolation dielectric 105 and/or the gate spacers 142 are closer to the sidewalls 184 than the top surfaces 182, and therefore, the sidewalls 184 may have impurity concentrations higher than that of central regions of the top surfaces 182. In some embodiments, (111) facets of the epitaxy features 180 can serve as the sidewalls 184.

In some embodiments, the corner portions 183 having higher impurity concentrations and/or higher dopant depths are at least partially present in the raised portions 185 of the epitaxy features 180. That is, the corner portions 183 having higher impurity concentrations and/or higher dopant depths are at least partially raised with respect to the semiconductor fin 114. Moreover, the corner portions 183 having the higher impurity concentrations and/or higher dopant depths may further extend into the embedded portions 187 of the epitaxy features 180. That is, the corner portions 183 having higher impurity concentrations and/or higher dopant depths are at least partially present in the recesses 114r of the semiconductor fins 114. In other words, portions of the corner portions 183 lower than the top central portions 181 have impurity concentrations higher than that of the top central portions 181.

Figure 12:
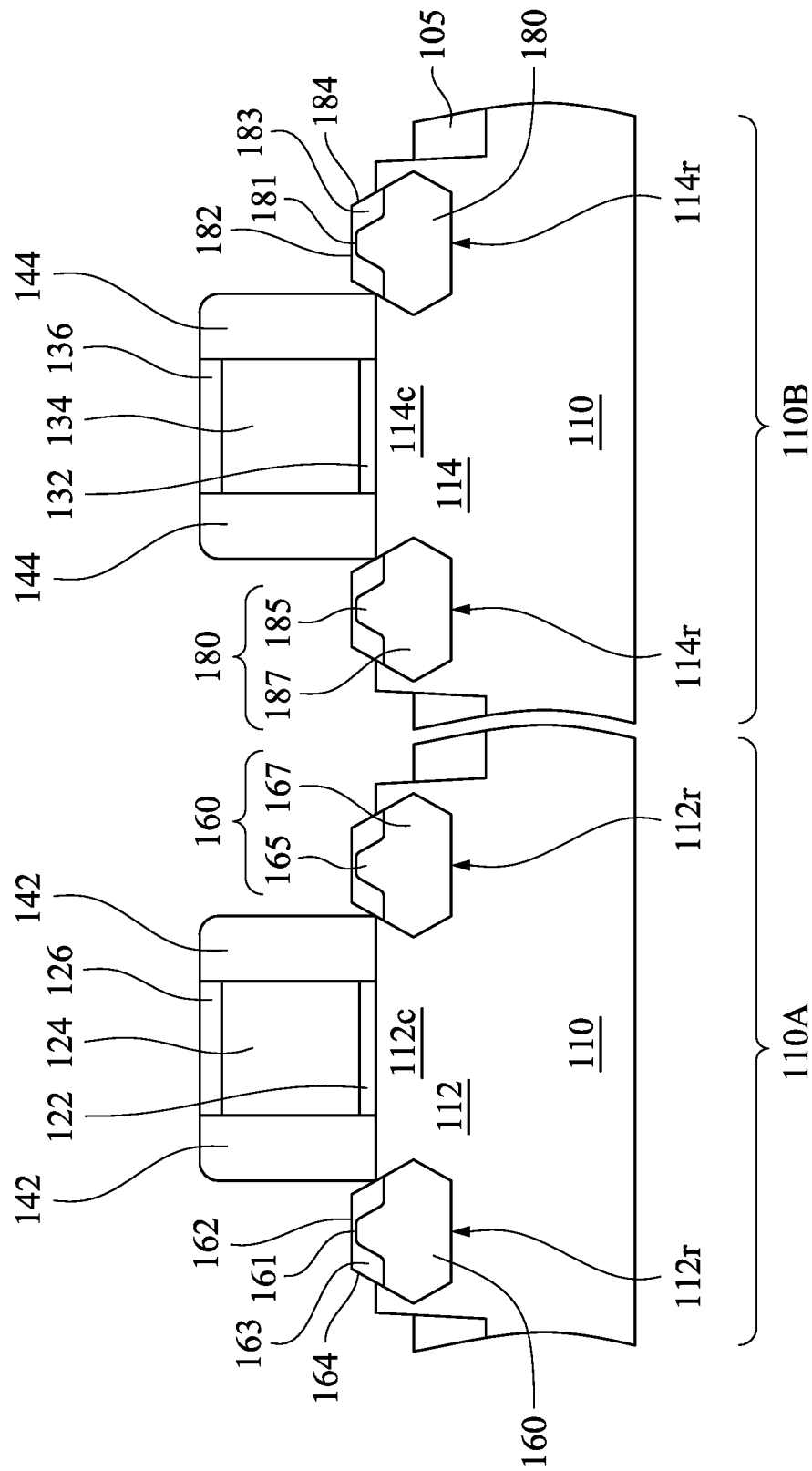

Reference is made to FIG. 12. The mask 240 covering the first portion 110A of the substrate 110 is removed by an etching process. The removal process may also remove the dopant source layers 220, 260 and the screening layer 190 in some embodiments. In the embodiments where the mask 240 is an oxide mask such as silicon oxide, an exemplary method of removing the mask 240, the dopant source layers 220, 260 and the screening layer 190 may be wet etching, such as dipping the substrate 110 in a wet solution comprising HF or by a dry etching process.

The sequence of forming the doped epitaxy features 160 and 180 illustrated in FIGS. 8-12 are exemplary. Other sequences of forming these doped epitaxy features 160 and 180 are feasible in some other embodiments. For example, the PLAD process 210 can be performed immediately after forming the epitaxy features 160, the PLAD process 250 can be performed immediately after forming the epitaxy features 180, and the epitaxy features 160 and 180 can undergo the same annealing process, so that doped portions 161, 163, 181 and 183 can be formed by the same annealing process. During the later one of PLAD processes 210 and 250, some portions are masked in some embodiments.

Figure 13:
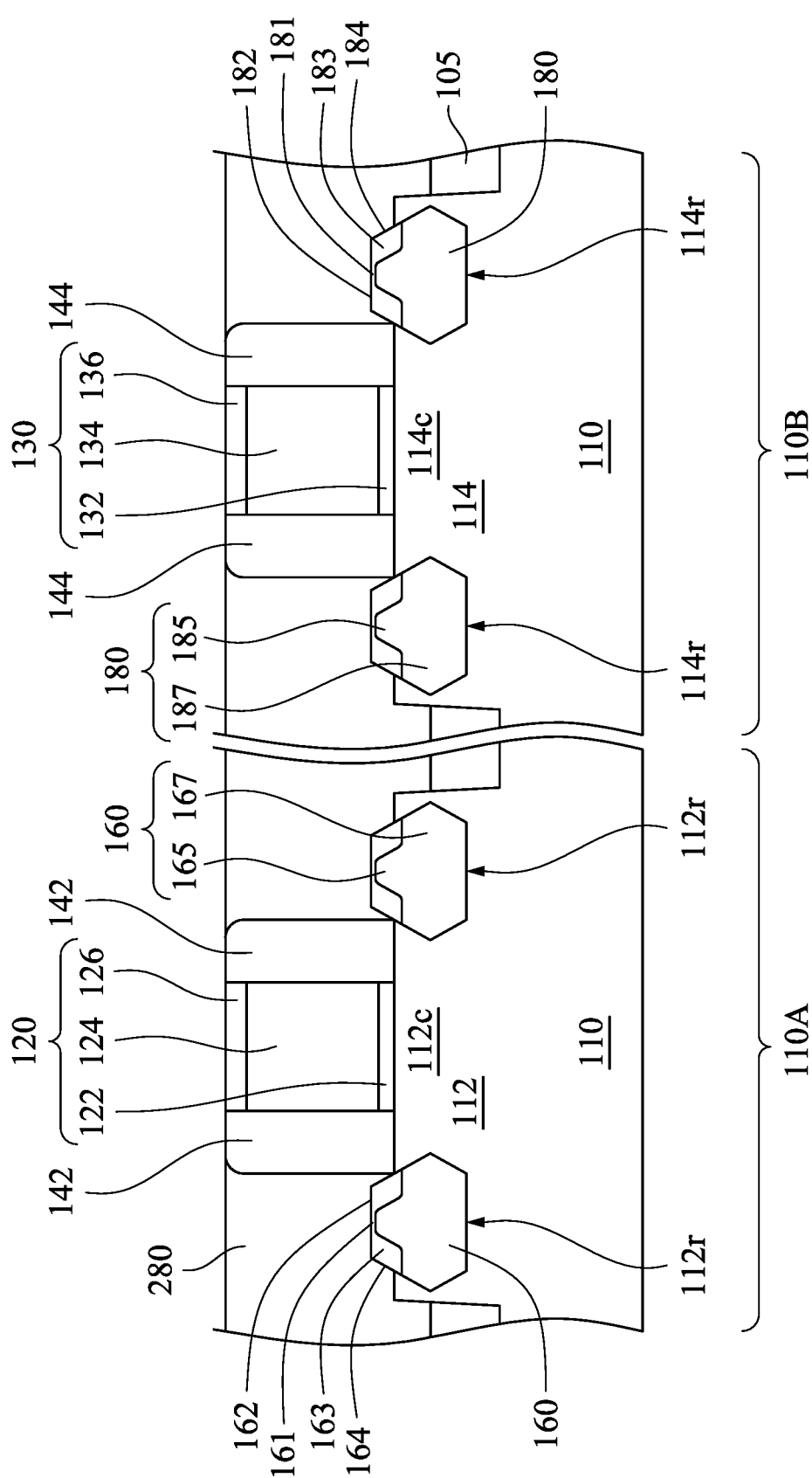

Thereafter, as shown in FIG. 13, an interlayer dielectric (ILD) layer 280 is formed at outer sides of the gate spacers 142 and 144 and on the substrate 110. The ILD layer 280 includes silicon oxide, silicon nitride, silicon oxynitride, silicon carbide, low-dielectric constant dielectric material or a combination thereof. Contact etch stop layer (CESL) may be blanket formed on the substrate 110 before the formation of the ILD layer 280 in some embodiments. The ILD layer 280 includes a single layer or multiple layers. The ILD layer 280 is formed by a suitable technique, such as CVD, ALD, and spin-on (SOG). A chemical mechanical planarization (CMP) process may be performed to remove excessive material of the ILD layer 280 and planarize a top surface of the ILD layer 280 with top surfaces of the gate structures 120 and 130 in some embodiments. Alternatively, the CMP process may further remove mask layers 126 and 136 to expose their respective underlying gate electrodes 124 and 134, and this CMP process may remove uppermost portions of the gate spacers 142 and 144 adjacent to the mask layers 126 and 136 as well.

Figure 14:
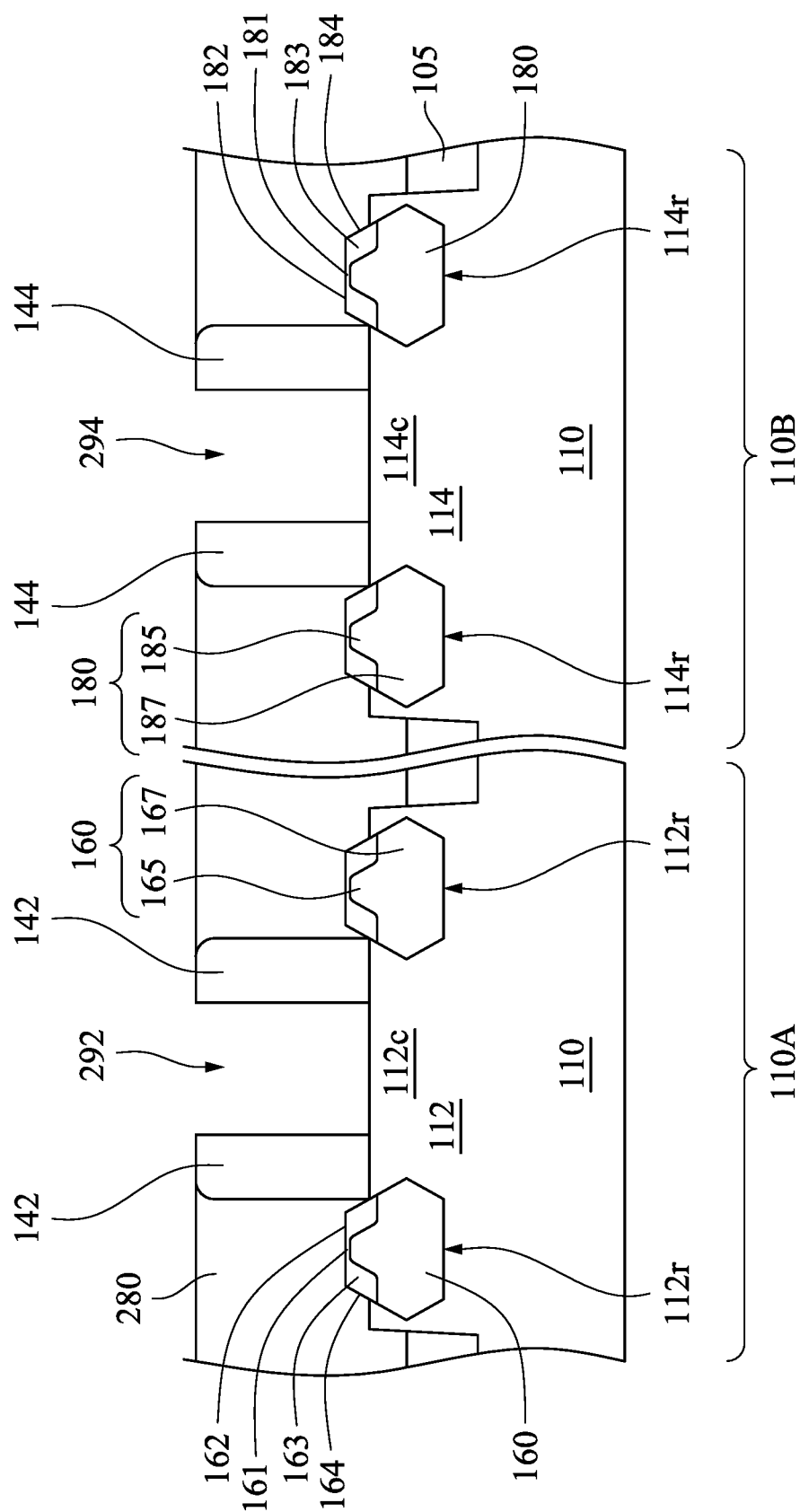

Reference is made to FIG. 14. The gate structures 120 and 130 are removed to form a gate trench 292 with the gate spacers 142 as its sidewalls and a gate trench 294 with the gate spacers 144 as its sidewalls. In some embodiments, the gate dielectric layers 122 and 132 are removed. In alternatively embodiments, the gate electrodes 124 and 134 are removed while the gate dielectric layers 122 and 132 retain. The gate structures 120 and 130 may be removed by dry etching, wet etching, or a combination of dry and wet etching. The etching processes may include selective wet etching or selective dry etching processes. In some embodiments, mask layers 126, 136, gate electrodes 124, 134 and gate dielectric layers 122 and 132 may be removed by a series of processes including photolithography patterning to protect the other portions (e.g., the ILD layer 280) and etching back the mask layers 126, 136, and gate electrodes 124, 134 and gate dielectric layers 122 and 132.

Figure 15:
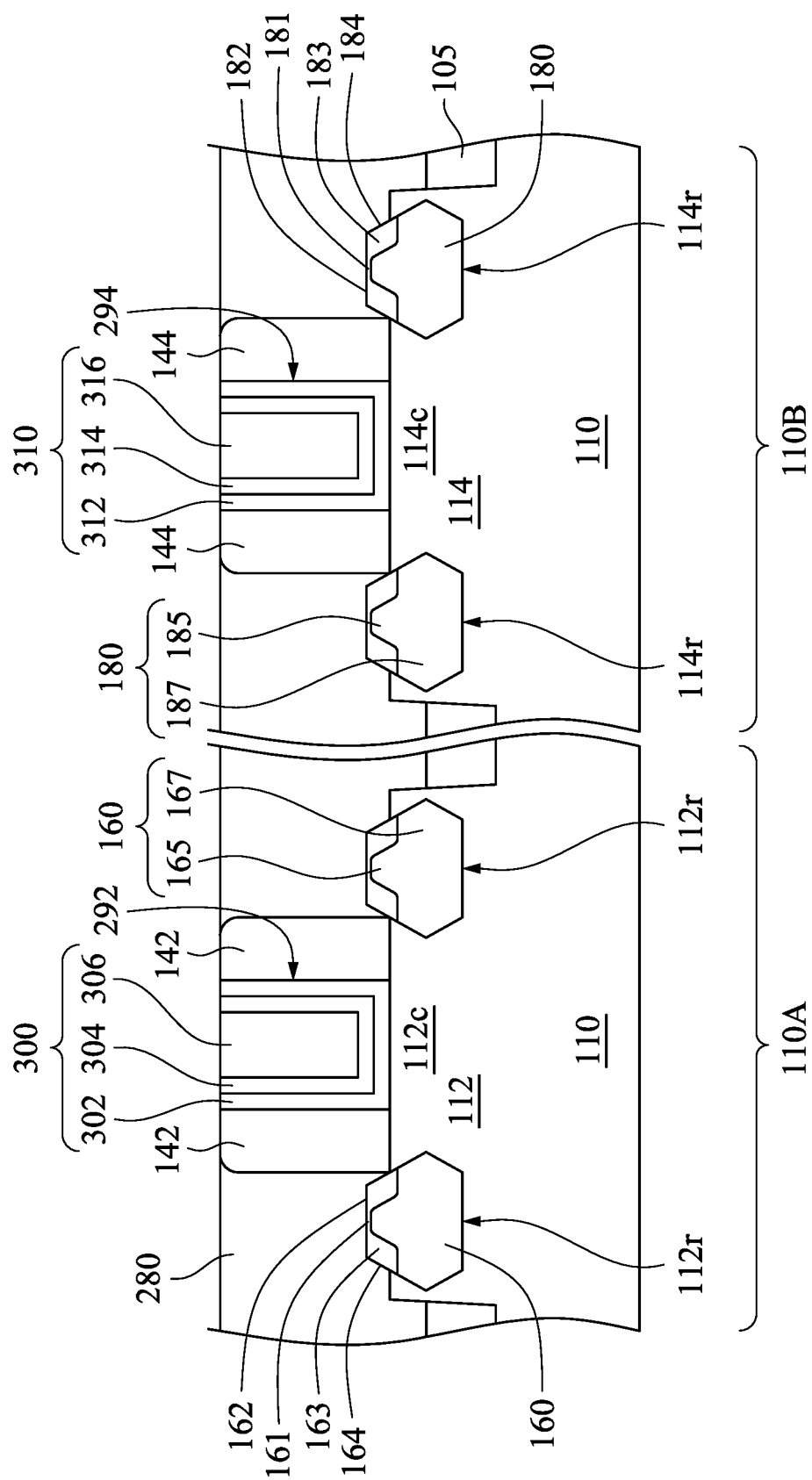

Reference is made to FIG. 15. Gate stacks 300 and 310 are respectively formed in the gate trenches 292 and 294. The gate stacks 300 are formed across the semiconductor fin 112 and extend along the gate spacers 142. The gate stack 300 may include a gate dielectric layer 302, a work function conductor 304 on the gate dielectric layer 302 and a filling conductor 306 on the work function conductor 304. Similarly, the gate stack 310 may include a gate dielectric layer 312, a work function conductor 314 and a filling conductor 316. In some embodiments, the gate dielectric layers 302 and 312 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layers 302 and 312 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric layers 302 and 312 may have a multilayer structure such as one layer of silicon oxide (e.g., interfacial layer) and another layer of high-k material.

The work function conductors 304 and 314 may include work function metals to provide a suitable work function for the gate stacks 300 and 310. For example, the work function conductor 304 may include one or more n-type work function metals (N-metal) for forming an NMOS transistor on the first portion 110A. The n-type work function metals may exemplarily include, but are not limited to, titanium aluminide (TiAl), titanium aluminium nitride (TiAlN), carbonitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, the work function conductor 314 may include one or more p-type work function metals (P-metal) for forming a PMOS transistor on the second portion 110B. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. The filling conductors 306 and 316 respectively fill recesses in the work function conductors 304 and 314. The filling conductors 306 and 316 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Exemplary method of forming the gate stacks 300 may include forming a blanket gate dielectric layer over the structure shown in FIG. 14, forming one or more work function conductor layers over the blanket gate dielectric layer, forming a filling conductor layer over the work function conductor layers, wherein some portions of the filling conductor layer overfill the gate trenches 292 and 294 shown in FIG. 14, and performing a CMP process to remove excessive materials of the filling conductor layer, the work function conductor layers and the gate dielectric layer outside the gate trenches 292 and 294.

Figure 16:
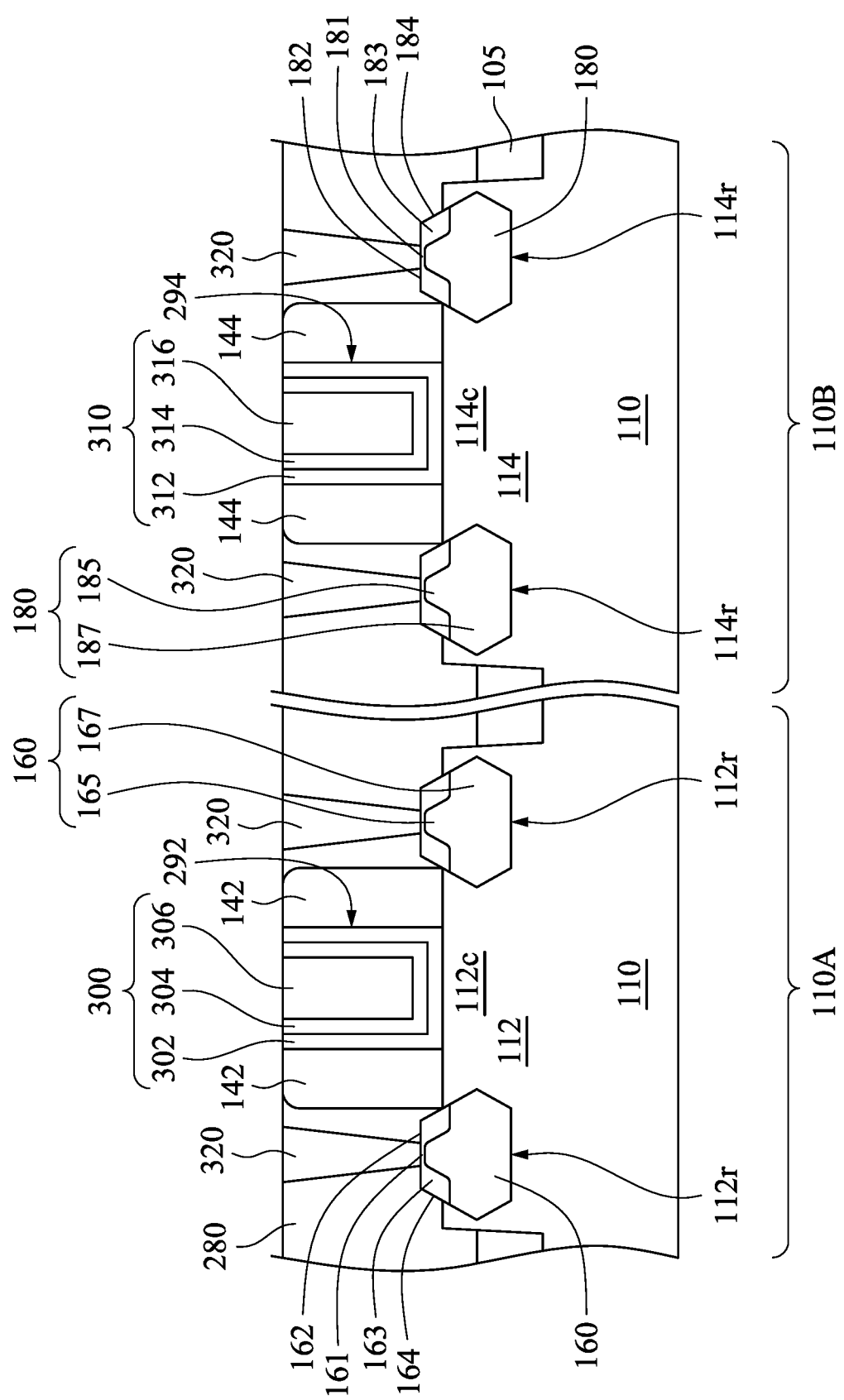

Reference is made to FIG. 16. Contact plugs 320 are formed through the ILD layer 280 and in contact with the epitaxy features 160 and 180, respectively. The contact plugs 320 can serve as source/drain contacts accordingly. The contact resistance between the epitaxy features 160, 180 and the contact plugs 320 can be increased because the epitaxy features 160 and 180 can have improved impurity concentrations using the combination of the plasma doping processes and the annealing processes. Formation of the contact plugs 320 may include forming contact holes by an etching process to etch through the ILD layer 280 down to the epitaxy features 160 and 180 and depositing metal in the contact hole by a deposition process, such as a CVD process, to form the contact plugs 320.

Some embodiments of the present disclosure may include at least following advantages. The combination of plasma doping processes and annealing process may be advantageous to make the epitaxy features have impurity concentrations high enough to reduce the contact resistance between the epitaxy features and the contact plugs thereon. Moreover, in-situ doping during the epitaxy processes can be omitted, so that the time duration of the epitaxy processes can be reduced. Further, by utilizing an oxide mask during the plasma doping processes, as opposed to a photoresist mask, the photoresist scum on the final product can be obviated.

According to some embodiments, a semiconductor device includes a semiconductor substrate, a dielectric feature and an epitaxy feature. The epitaxy feature is on the semiconductor substrate. The epitaxy feature has a top central portion and a corner portion. The dielectric feature is closer to the corner portion than the top central portion. An impurity concentration of the corner portion is higher than an impurity concentration of the top central portion.

According to some embodiments, a semiconductor device includes a semiconductor substrate, a dielectric feature and an epitaxy feature. The epitaxy feature is on the semiconductor substrate. The epitaxy feature has a central portion and at least one edge portion. The dielectric feature is closer to the edge portion than the central portion. The edge portion has a dopant depth deeper than that of the central portion.

According to some embodiments, a method of forming a semiconductor device includes forming an epitaxy feature on a semiconductor substrate, forming a dopant source layer to cap a top surface and a sidewall of the epitaxy feature, and diffusing a dopant from the dopant source layer into the epitaxy feature through the capped top surface and the sidewall of the epitaxy feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   forming a gate structure on a semiconductive fin;
   forming a gate spacer alongside the gate structure;
   etching a recess in the semiconductive fin;
   forming an epitaxy feature in the recess, wherein the epitaxy feature has a top surface higher than a top of the semiconductive fin and a sidewall extending upwards from a position directly under the gate spacer to the top surface of the epitaxy feature;
   after forming the gate spacer, forming a dopant source layer to cap the top surface and at least a portion of the sidewall of the epitaxy feature; and
   diffusing a dopant from the dopant source layer into the epitaxy feature through the capped top surface and the capped sidewall of the epitaxy feature, wherein a dopant depth from the sidewall of the epitaxy feature is deeper than a dopant depth from a central region of the top surface of the epitaxy feature.

2. The method of claim 1, wherein the forming the dopant source layer comprises forming the dopant source layer using a plasma-assisted process.

3. The method of claim 1, further comprising:
   removing the dopant source layer; and
   forming a contact plug on the epitaxy feature.

4. The method of claim 1, wherein the forming the gate spacer is performed prior to forming the epitaxy feature, wherein the epitaxy feature is formed such that the sidewall of the epitaxy feature is formed between the gate spacer and the top surface of the epitaxy feature,
   wherein after the diffusing the dopant, the sidewall of the epitaxy feature has an impurity concentration higher than that of the central region of the top surface of the epitaxy feature.

5. The method of claim 1, further comprising:
   covering the portion of the semiconductive fin with an oxide mask prior to forming the dopant source layer; and
   removing the oxide mask after forming the dopant source layer.

6. A method, comprising:
   forming a gate spacer on a semiconductor fin;
   forming an epitaxy feature on the semiconductor fin, wherein the epitaxy feature has a top surface higher than a top of the semiconductor fin, a first inclined sidewall extending downwards from the top surface of the epitaxy feature to a position directly under the gate spacer, and a second inclined sidewall extending downwards from the top surface of the epitaxy feature in a direction laterally away from the gate spacer;

forming a dopant source layer to cap the top surface and at least a portion of the second inclined sidewall of the epitaxy feature, wherein the dopant source layer has an inclined portion extending parallel to the second inclined sidewall of the epitaxy feature; and diffusing a dopant from the dopant source layer into the epitaxy feature through the capped top surface and the capped first and second inclined sidewalls of the epitaxy feature.

7. The method of claim 6, wherein forming the dopant source layer comprises placing the semiconductor fin in a chamber containing plasma generated from an n-type dopant gas or a p-type dopant gas.

8. The method of claim 6, wherein diffusing the dopant comprises an annealing process.

9. The method of claim 6, wherein the dopant has higher solid solubility in the epitaxy feature than in the gate spacer.

10. The method of claim 6, further comprising:
forming a gate structure on the semiconductor fin prior to forming the epitaxy feature; and
replacing the gate structure with a metal gate structure after diffusing the dopant.

11. The method of claim 6, further comprising:
removing the dopant source layer from the epitaxy feature; and
forming a contact plug on the epitaxy feature after removing the dopant source layer.

12. The method of claim 6, further comprising:
forming a screening oxide layer on the epitaxy feature prior to forming the dopant source layer, wherein diffusing the dopant from the dopant source layer is performed such that the dopant penetrates through the screening oxide layer to reach the epitaxy feature.

13. The method of claim 12, further comprising:
removing the screening oxide layer from the epitaxy feature after diffusing the dopant.

14. A method, comprising:
forming a gate structure on a semiconductor fin;
forming a gate spacer alongside the gate structure;
forming an epitaxy feature on the semiconductor fin, wherein the epitaxy feature has a top surface higher than a top of the semiconductor fin, a first inclined sidewall extending upwardly from a position directly under the gate spacer to the top surface of the epitaxy feature, and a second inclined sidewall extending downwards from the top surface of the epitaxy feature in a direction laterally away from the gate spacer;

after forming the gate spacer, forming an oxide mask to cover a portion of the semiconductor fin;

after forming the oxide mask, forming a dopant source layer having a horizontal portion over the top surface of the epitaxy feature and an inclined portion over the second inclined sidewall of the epitaxy feature; and diffusing a dopant from the dopant source layer into the epitaxy feature through the top surface and the second inclined sidewall of the epitaxy feature.

15. The method of claim 14, wherein forming the dopant source layer comprises placing the semiconductor fin in a chamber containing plasma generated from an n-type dopant gas or a p-type dopant gas.

16. The method of claim 14, wherein diffusing the dopant from the dopant source layer into the epitaxy feature is a solid phase diffusion process.

17. The method of claim 14, wherein the dopant has higher solid solubility in the epitaxy feature than in the gate spacer.

18. The method of claim 14, wherein forming the dopant source layer is performed such that the gate spacer is capped by the dopant source layer, and the method further comprises:
removing the dopant source layer from the gate spacer.

19. The method of claim 14, further comprising:
forming a screen oxide layer on the gate spacer and the epitaxy feature prior to forming the dopant source layer, wherein the screen oxide layer screens the dopant during the diffusing of the dopant from the dopant source layer into the epitaxy feature.

20. The method of claim 19, further comprising:
removing the screen oxide layer from the gate spacer after diffusing the dopant.

* * * * *